US007656380B2

(12) United States Patent
Koyama et al.

(10) Patent No.: US 7,656,380 B2
(45) Date of Patent: Feb. 2, 2010

(54) DISPLAY DEVICE

(75) Inventors: Jun Koyama, Atsugi (JP); Tomoaki Atsumi, Atsugi (JP); Hiroyuki Miyake, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 352 days.

(21) Appl. No.: 09/970,929

(22) Filed: Oct. 5, 2001

(65) Prior Publication Data

US 2002/0047827 A1 Apr. 25, 2002

(30) Foreign Application Priority Data

Oct. 23, 2000 (JP) ............................. 2000-322121

(51) Int. Cl.
G09G 3/36 (2006.01)
G11C 19/00 (2006.01)
(52) U.S. Cl. ........................................ 345/100; 377/64
(58) Field of Classification Search ........... 345/30–111, 345/211–214, 204–205; 377/57, 64–81
See application file for complete search history.

(56) References Cited

U.S. PATENT DOCUMENTS

| 3,742,142 | A | | 6/1973 | Martin |
| 4,367,557 | A | * | 1/1983 | Stern et al. .................. 725/149 |
| 4,746,915 | A | | 5/1988 | Sekiya |
| 5,051,739 | A | | 9/1991 | Hayashida et al. |
| 5,214,417 | A | | 5/1993 | Yamazaki |
| 5,250,931 | A | | 10/1993 | Misawa et al. |
| 5,323,171 | A | | 6/1994 | Yokouchi et al. |
| 5,343,221 | A | | 8/1994 | Arakawa et al. |
| 5,563,624 | A | | 10/1996 | Imamura |
| 5,574,475 | A | | 11/1996 | Callahan, Jr. et al. |
| 5,644,259 | A | | 7/1997 | Shishikura et al. |
| 5,850,204 | A | * | 12/1998 | Maekawa ..................... 345/98 |
| 5,886,679 | A | | 3/1999 | Matsuda et al. |
| 5,907,313 | A | | 5/1999 | Kubota et al. |
| 5,929,464 | A | | 7/1999 | Yamazaki et al. |
| 5,936,698 | A | | 8/1999 | Koyama |
| 5,949,397 | A | | 9/1999 | Koyama et al. |
| 5,953,003 | A | * | 9/1999 | Kwon et al. ................. 345/204 |
| 6,121,760 | A | * | 9/2000 | Marshall et al. ............. 323/282 |
| 6,162,704 | A | | 12/2000 | Yamazaki et al. |

(Continued)

FOREIGN PATENT DOCUMENTS

EP 0 269 744 6/1988

(Continued)

*Primary Examiner*—Srilakshmi K Kumar
(74) *Attorney, Agent, or Firm*—Eric J. Robinson; Robinson Intellectual Property Law Office, P.C.

(57) ABSTRACT

This invention provides a driving circuit for a display device, for accomplishing low power consumption by use of a level shifter capable of reliably converting signals having low voltage amplitude. A source signal line driving circuit is divided into a plurality of units. Pulses outputted from a shift register, etc, are used to execute ON/OFF control of the operation of a current supply source to the level shifter of each divided unit. The supply of the current to the level shifter is suspended in the stage not containing the circuit that outputs the pulses, but is made to only the unit including the shift register of the operating stage. In consequence, low power consumption can be achieved.

64 Claims, 17 Drawing Sheets

U.S. PATENT DOCUMENTS

| | | |
|---|---|---|
| 6,177,920 B1 | 1/2001 | Koyama et al. |
| 6,256,024 B1 * | 7/2001 | Maekawa ................... 345/205 |
| 6,295,047 B1 | 9/2001 | Koyama et al. |
| 6,476,791 B2 | 11/2002 | Koyama et al. |
| 6,559,821 B2 * | 5/2003 | Ichikawa et al. .............. 345/92 |
| 6,664,943 B1 | 12/2003 | Nakajima et al. |
| 6,724,363 B1 * | 4/2004 | Satoh et al. .................. 345/100 |
| 6,731,273 B2 | 5/2004 | Koyama et al. |
| 6,897,847 B2 | 5/2005 | Koyama et al. |
| 2002/0021295 A1 | 2/2002 | Koyama et al. |
| 2002/0024485 A1 | 2/2002 | Koyama |
| 2002/0041266 A1 | 4/2002 | Koyama et al. |
| 2002/0145602 A1 * | 10/2002 | Matsueda ................... 345/213 |
| 2004/0066361 A1 * | 4/2004 | Ishii et al. .................... 345/87 |
| 2004/0150607 A1 | 8/2004 | Nakajima et al. |
| 2004/0201410 A1 | 10/2004 | Koyama et al. |

FOREIGN PATENT DOCUMENTS

| | | |
|---|---|---|
| EP | 1 014 334 | 6/2000 |
| EP | 1 020 839 | 7/2000 |
| JP | 55-146490 | 11/1980 |
| JP | 63-073295 | 4/1988 |
| JP | 02-105194 | 4/1990 |
| JP | 06-104416 | 4/1994 |
| JP | 2000-224024 | 8/2000 |
| JP | 2002-118458 | 4/2002 |
| JP | 2002-132234 | 5/2002 |
| JP | 2002-149138 | 5/2002 |
| JP | 2002-196306 | 7/2002 |

* cited by examiner

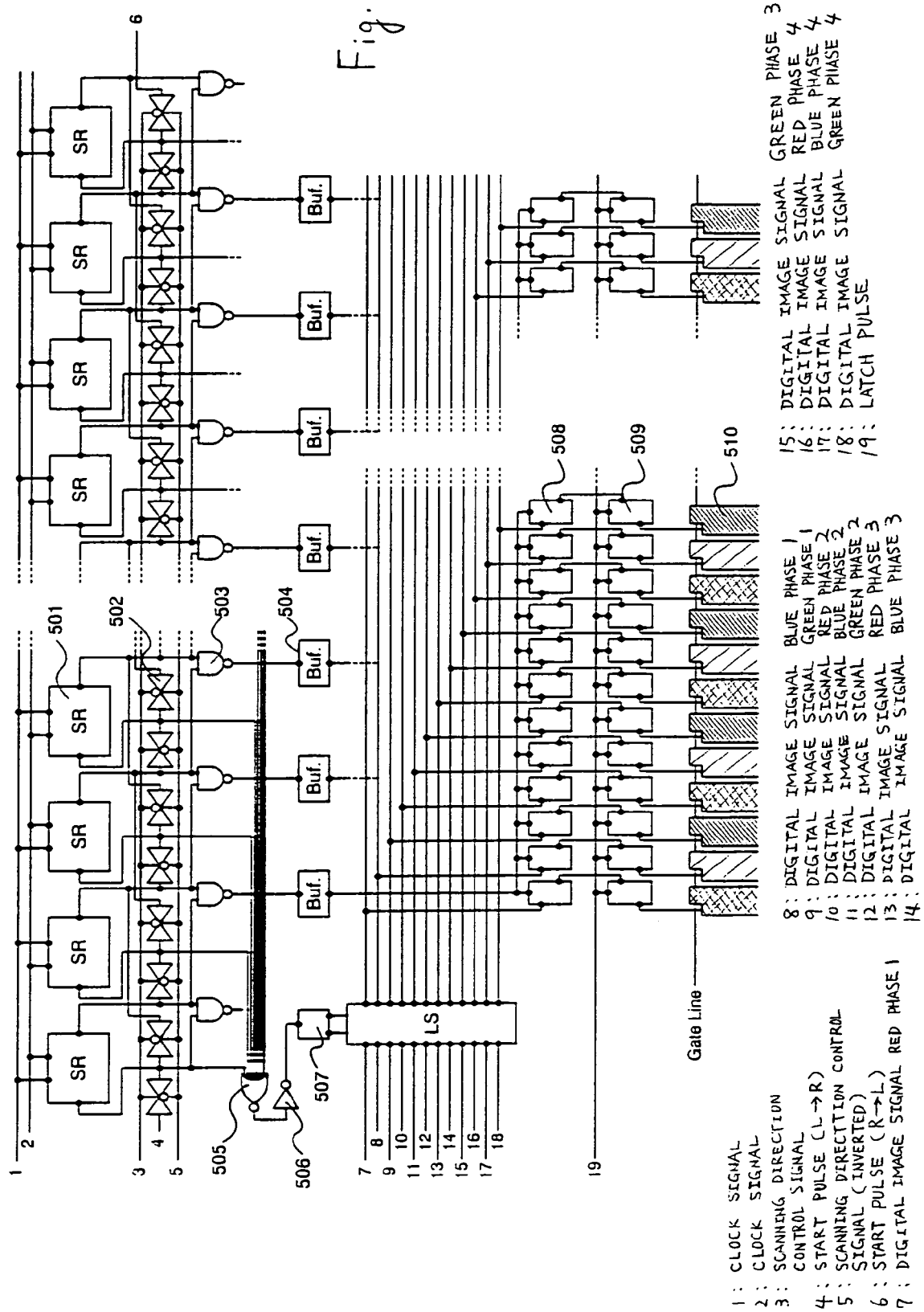

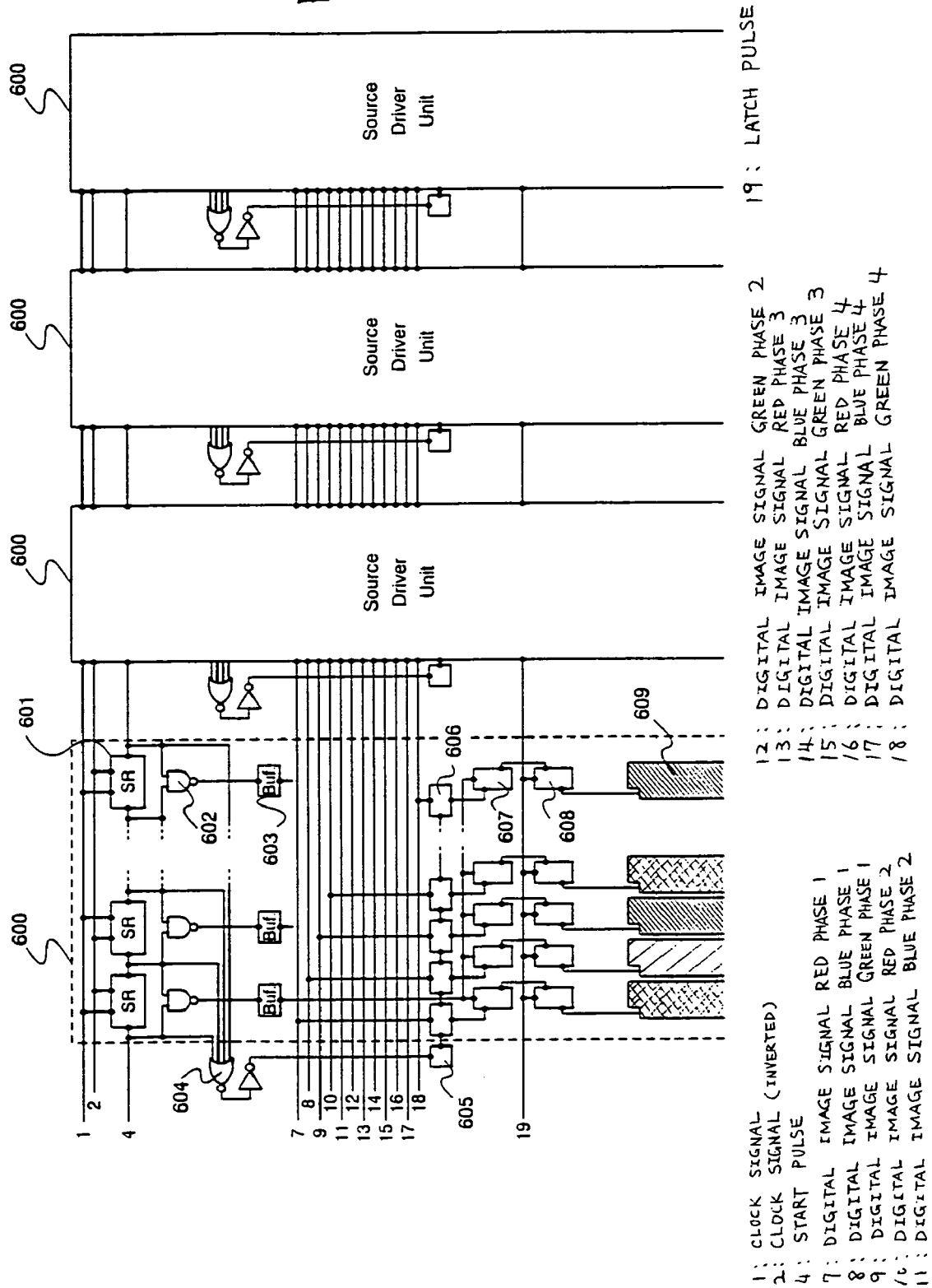

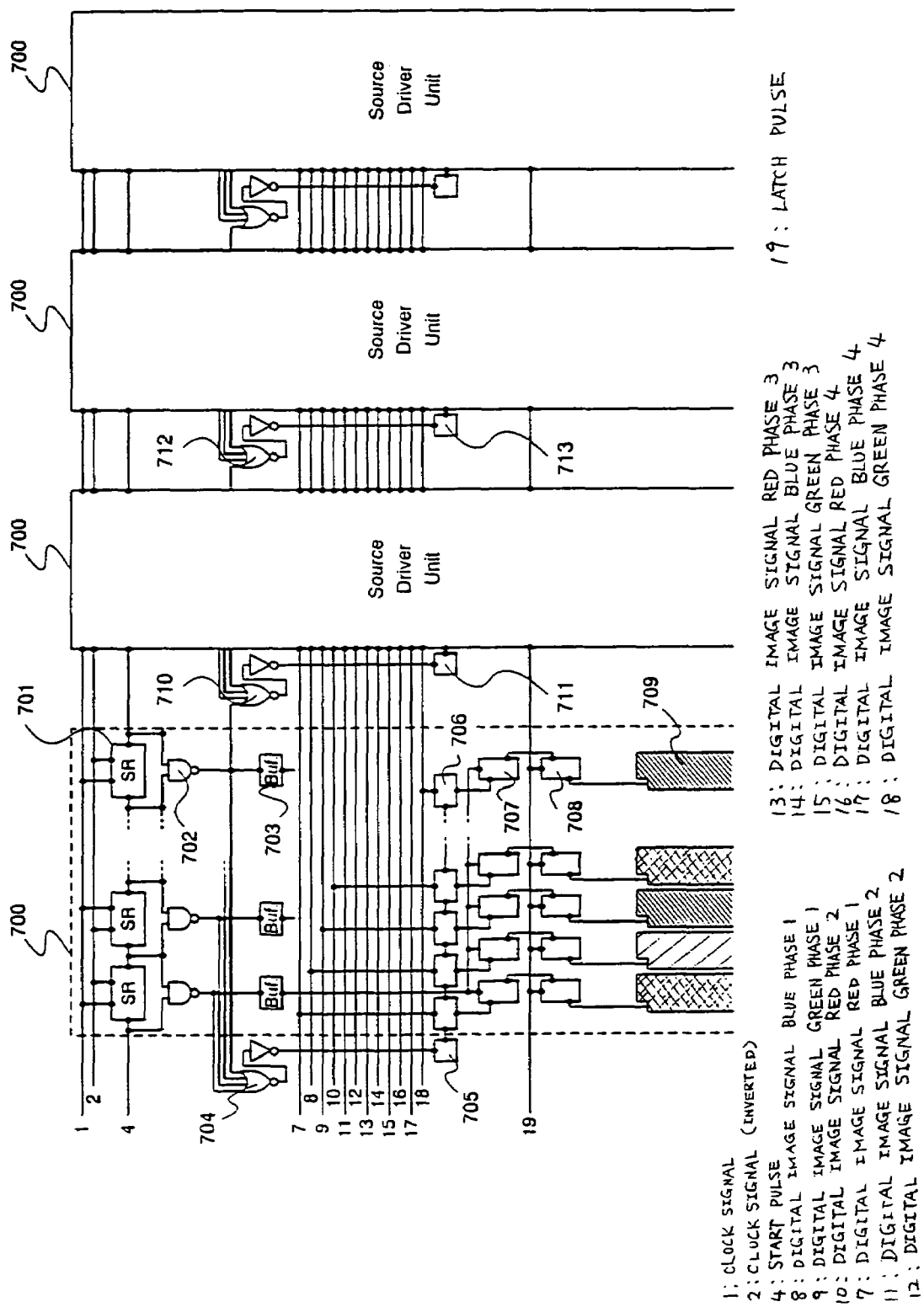

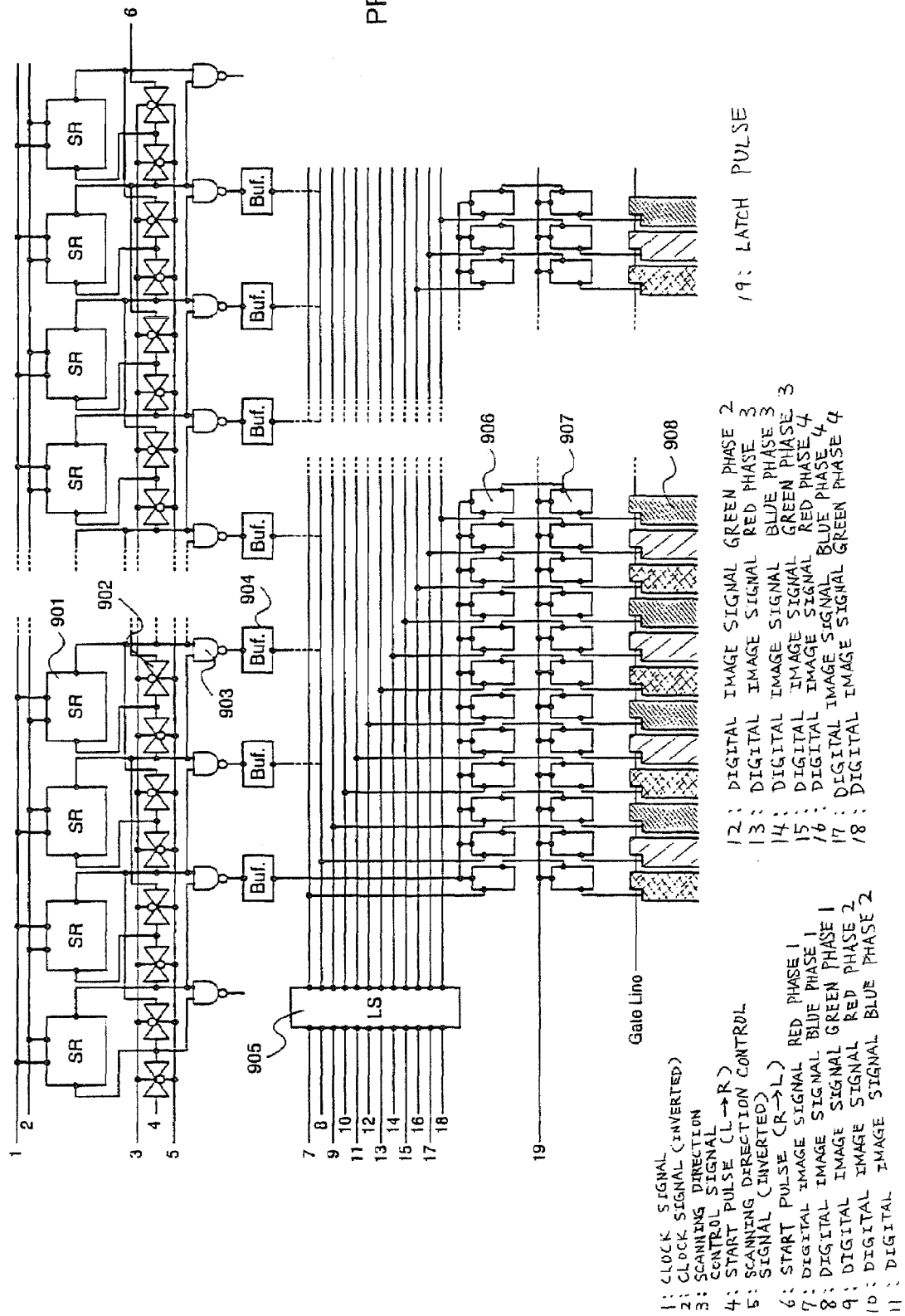

Fig.10 (A) PRIOR ART
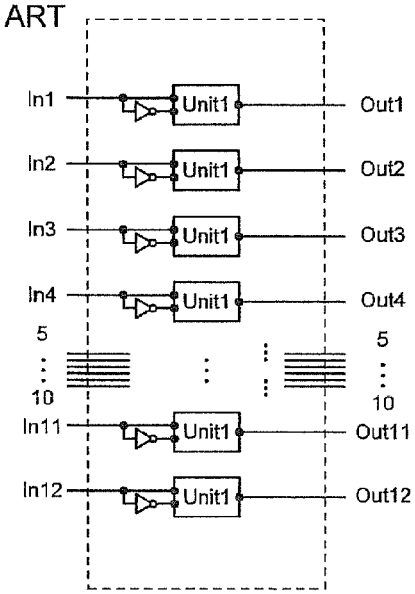
Fig.10 (B) PRIOR ART
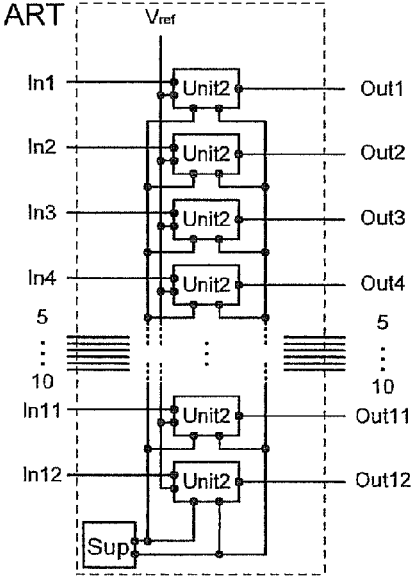
Fig.10 (C) PRIOR ART
Fig.10 (D) PRIOR ART
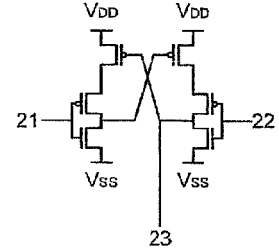
Fig.10 (E) PRIOR ART
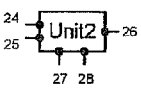
Fig.10 (F) PRIOR ART
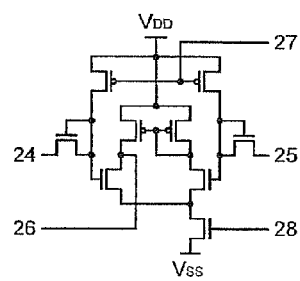
Fig.10 (G) PRIOR ART
Fig.10 (H) PRIOR ART
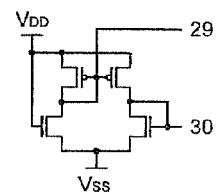

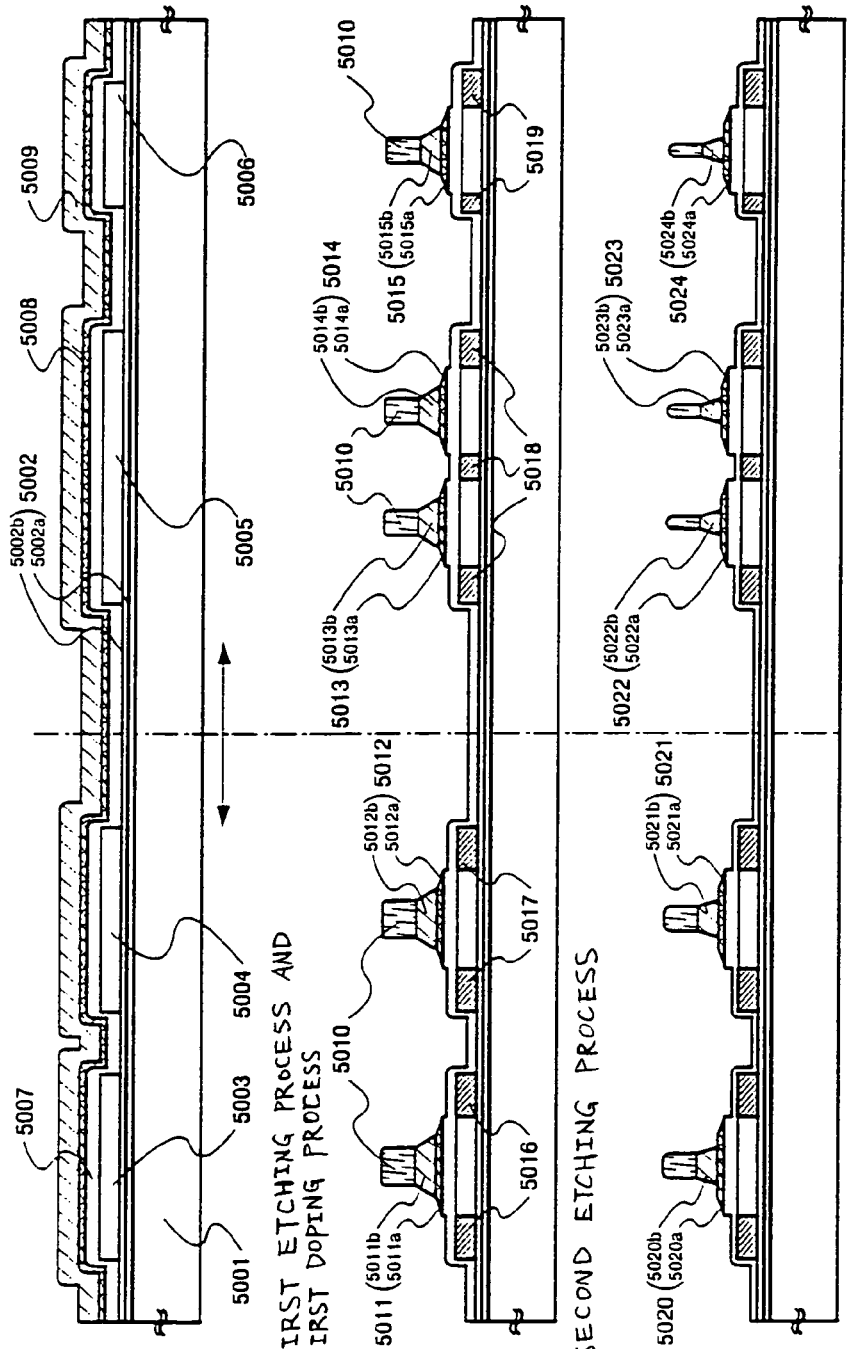

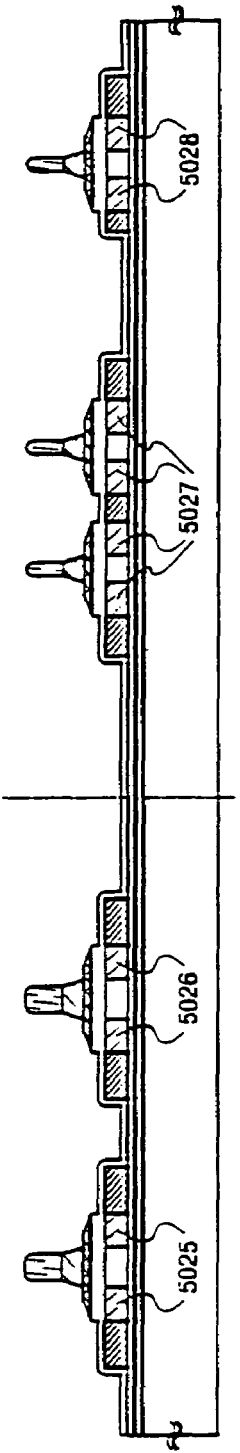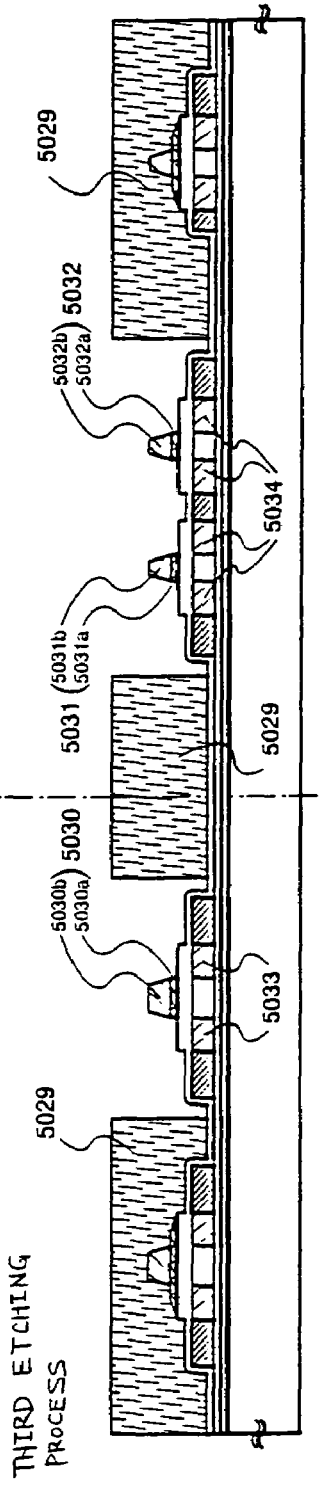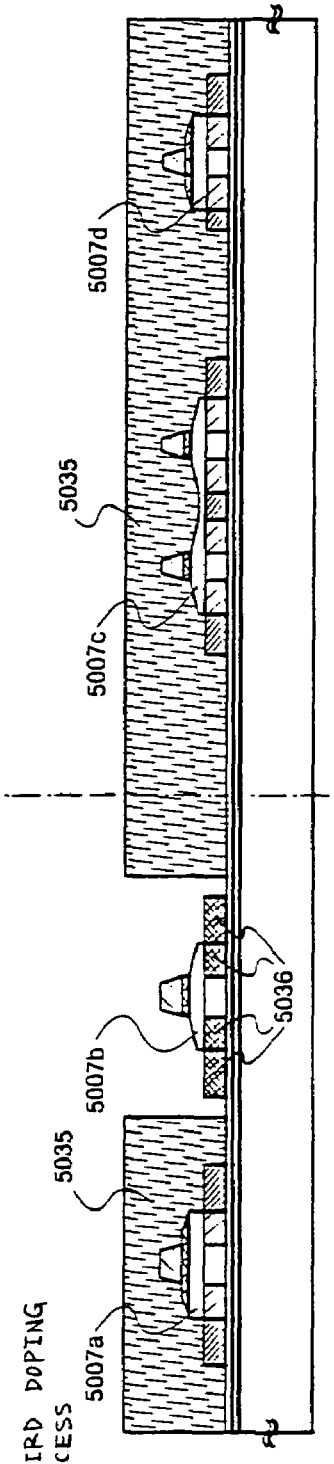

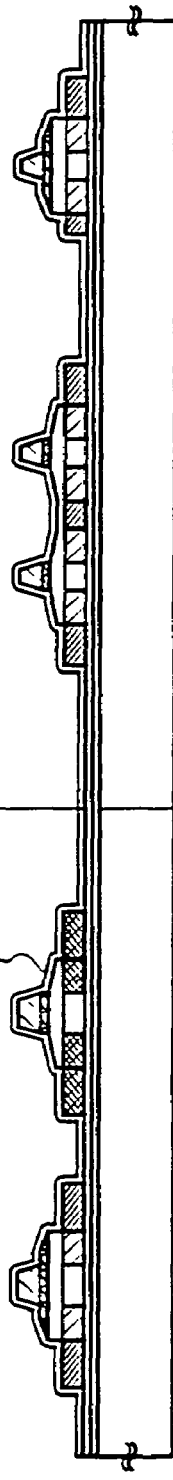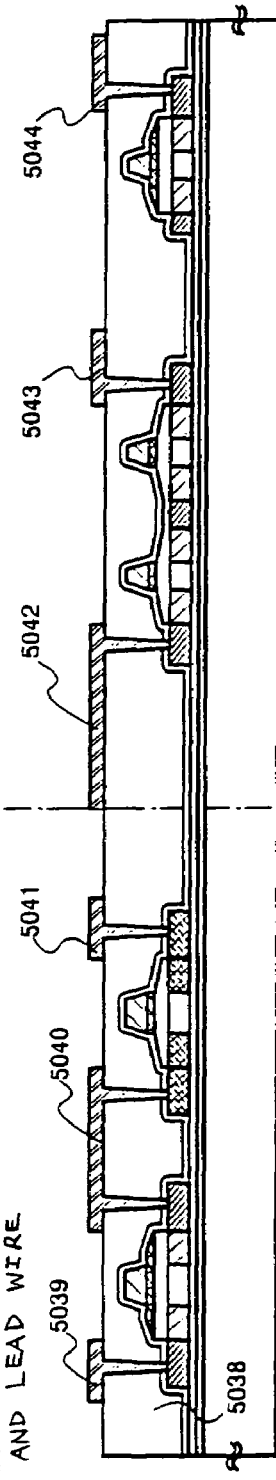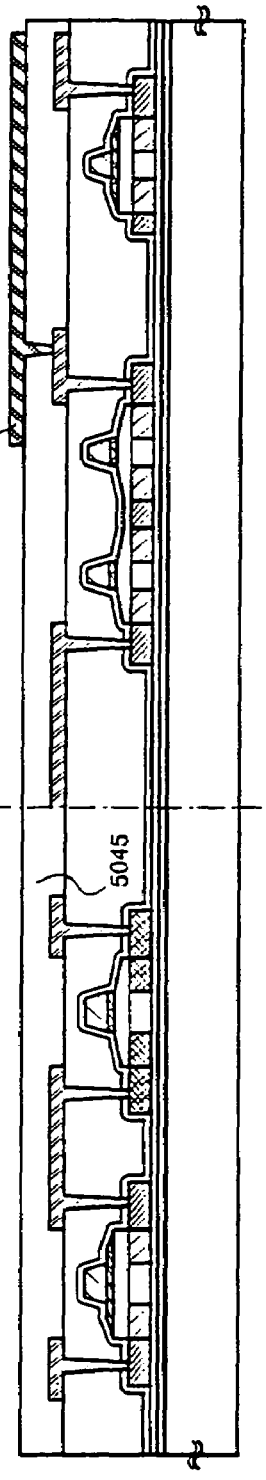
Fig. 13(A) FORMATION OF FIRST INTER-LAYER INSULATING FILM / ACTIVATION PROCESS
Fig. 13(B) FORMATION OF SECOND INTERLAYER INSULATING FILM AND LEAD WIRE
Fig. 13(C) FORMATION OF THIRD INTER-LAYER INSULATING FILM AND REFLECTION ELECTRODE

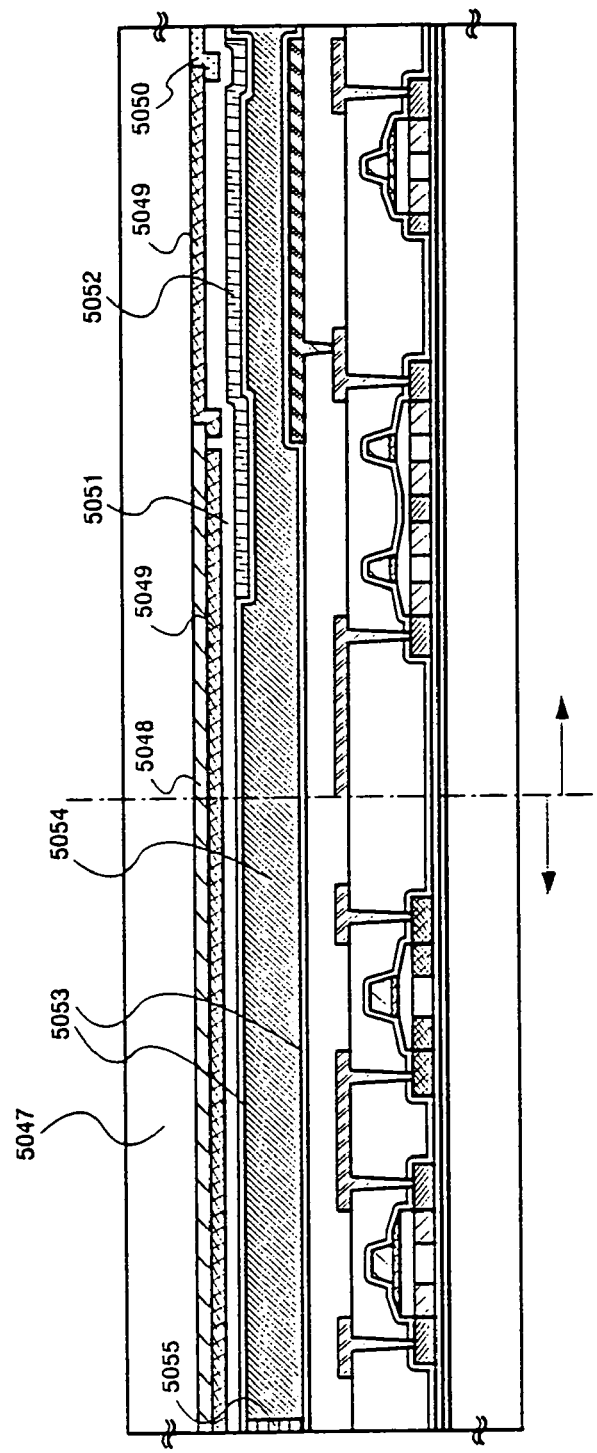
Fig. 14 FORMATION OF OPPOSING SUBSTRATE / INJECTION OF LIQUID CRYSTAL MATERIAL

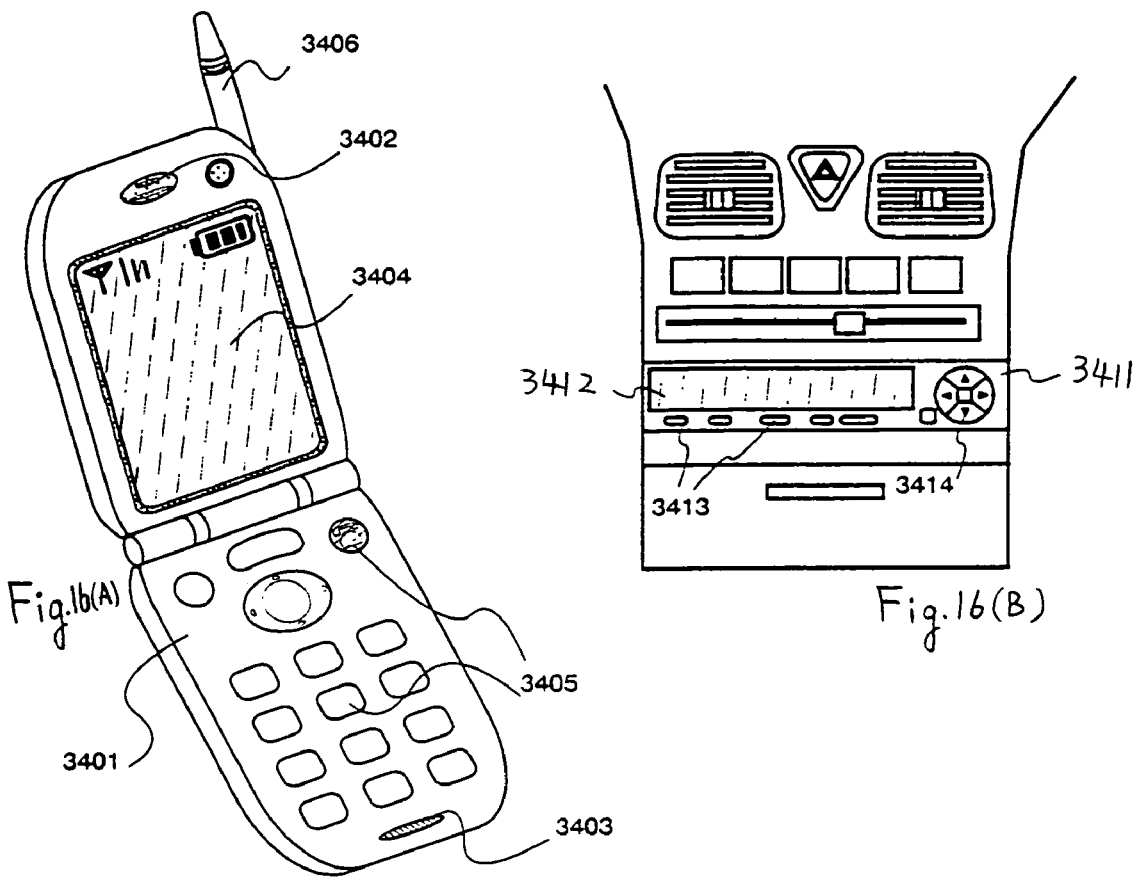
Fig.16(A)
Fig.16(B)
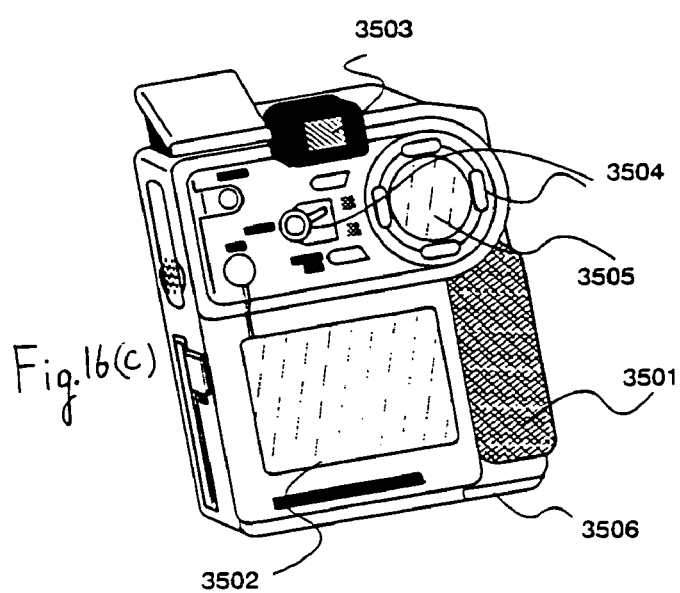
Fig.16(C)

DISPLAY DEVICE

BACKGROUND OF THE INVENTION

1. Field of the Invention

This invention relates to a display device and a driving circuit of the display device. More particularly, this invention relates to an active matrix type display device having thin film transistors formed on an insulating body, and to a driving circuit of the active matrix type display device.

2. Description of the Related Art

The progress of miniaturization in semiconductor fabrication technologies has in turn brought forth miniaturization of LSI. As the application of such miniature LSI to small appliances such as hand-held terminals has made a progress, lower power consumption has now become a requisite. Therefore, LSI of a low voltage driving type such as 3.3 V has become predominant at present. In LCD (Liquid Crystal Display) the demand for which has been remarkably increasing nowadays in the application as a monitor for hand-held terminals and computers, on the other hand, driving of the liquid crystal is made by signals having a voltage amplitude of 10V to 20V in most cases. Therefore, at least a circuit portion driven at a high power source voltage corresponding to this driving circuit coexists. For this reason, it is essentially necessary to connect the controller LSI driven at the low voltage described above and the liquid crystal driving circuit driven at the high power source voltage by a level shifter that changes the voltage amplitude of signals.

Besides the LCD, displays using electroluminescence devices (which will be hereinafter called "EL devices" and define both single-term emission and triple-term emission as EL) have been developed recently, and the requirement for low power consumption is also strong in this field.

FIG. 9 of the accompanying drawings illustrates an example of a source signal line driving circuit of the display device. Here, a start pulse, a clock signal, a digital image signal, etc, are those signals that are inputted from outside the display device. Since these signals are supplied from the controller LSI described above, the voltage amplitude is generally low voltage amplitude of 3.3 V, or the like. Therefore, in the driving circuit shown in FIG. 9, the digital image signal is subjected to voltage amplitude conversion (level conversion) by a level shifter 905 immediately after it is inputted. The signals inputted from the external controller LSI such as the clock signal and the start pulse are likewise subjected to level conversion though not specifically shown in the drawing.

The circuit operation will be explained. The shift register 901 outputs pulses in accordance with the clock signal and the start pulse, and the pulses of two adjacent stages are inputted to a NAND circuit 903. The NAND circuit 903 outputs a pulse having a low (Lo) potential from its output terminal only when a pulse having a high (Hi) potential is inputted to both of two-input terminals. After passing though a buffer (abbreviated as "Buf.") of a subsequent stage, the pulse changes to a first latch pulse. The pulse is then inputted to a first latch circuit 906. The digital image signal subjected to level conversion by the level shifter 905 is latched in accordance with the input timing of this first latch pulse. After this latch operation is conducted from the first stage to the final stage, the second latch pulse is inputted to a terminal 19 within a retrace line period, and the digital image signals for one horizontal period that are held by the first latch circuit 906 are altogether transferred to the second latch circuit 907. Thereafter, a gate signal line writes signals to pixels of the selected row to display the images.

FIGS. 10(A), 10(C) and 10(D) show an example where the level shifter 905 shown in FIG. 9 is constituted by a conventional level shifter. When voltage amplitude of the input signals (In, Inb) is as small as about 3.3 V, the level shifter having such a construction sometimes fails to normally conduct level conversion owing to influences of the threshold values of the TFT constituting the level shifter.

Therefore, a level shifter having a construction shown in FIGS. 10(B) and 10(E) to 10(H) is employed. The level shifter shown in FIGS. 10(B) and 10(E) to 10(H) conducts level conversion by means of a differential amplifier, and can accomplish a reliable level conversion function even when voltage amplitude of the input signals is small. Therefore, this is an extremely effective circuit for achieving low voltage driving of the circuit. The level shifter using the differential amplifier is disclosed in Japanese Patent Application No. 2000-193498.

On the other hand, the level shifter shown in FIGS. 10(B) and 10(E) to 10(H) needs a current source. In other words, since a constant current is always supplied during driving of the circuit (regardless of driving or stop of the level shifter), this current impedes low power consumption of the display device as a whole.

Lowering of the driving voltage of the driving circuit, etc, is originally directed to achieve low power consumption with the progress of hand-held terminals, etc, and it is technically meaningless if the circuit purposely employed to lower the driving voltage increases power consumption.

SUMMARY OF THE INVENTION

In view of the problems described above, the present invention aims at providing a driving circuit of a display device which driving circuit can cope with lowering of a driving voltage of peripheral circuits and can accomplish low power consumption.

To accomplish the object described above, the present invention employs the following means.

In the source signal line driving circuit shown in FIG. 9, a constant current is supplied to the level shifter 905 using the differential amplifier irrespective of the existence/absence of the sampling pulse, the digital image signal, and so forth. Therefore, the present invention divides the driving circuit into a plurality of units, and an independent current source in each unit supplies a current to a plurality of level shifters contained in each unit only inside those units in which a shift register operates (or a sampling pulse is outputted). In those units in which the shift register does not output the pulse, a latch operation of a digital image signal is not conducted, either. Therefore, the supply of the current to the level shifters in such a unit(s) is stopped. In consequence, power consumption in the unnecessary period can be suppressed.

Hereinafter, the construction of the driving circuit for the display device according to the present invention will be described.

In a display device including a source signal line driving circuit and a pixel portion both formed on a substrate, the driving circuit of a display device according to the first aspect of the present invention is characterized in that the source signal line driving circuit includes a shift register for serially outputting pulses in accordance with clock signals, a level shifter for converting a voltage amplitude of input signals and a current source for supplying a current to the level shifter, and the current source supplies the current only when the shift register serially outputs the pulses.

In a display device including a source signal line driving circuit and a pixel portion both formed on a substrate, the driving circuit of a display device according to the second aspect of the present invention is characterized in that the source signal line driving circuit includes first to xth (x: natural number, $x \geq 2$) units, the ath unit (a: natural number, $1 \leq a \leq x$) includes a shift register for serially outputting pulses in accordance with clock signals, a plurality of level shifters for converting a voltage amplitude of input signals and the ath current source for supplying a current to the plurality of level shifters, and the ath current source supplies the current to the plurality of level shifters only when the shift register in the ath unit serially outputs the pulses.

In a display device including a source signal line driving circuit and a pixel portion both formed on a substrate, the driving circuit of a display device according to the third aspect of the present invention is characterized in that the source signal line driving circuit includes first to xth (x: natural number, $x \geq 2$) units, the bth (b: natural number, $1 \leq b \leq x$) unit includes a shift register for serially outputting pulses in accordance with clock signals, a plurality of level shifters for converting a voltage amplitude of input signals and the bth current source for supplying a current to the plurality of level shifters, and the bth current source supplies the current to the plurality of level shifters only during a part of the period in which the shift register in the b−1th unit serially outputs the pulses and only when the shift register in the bth unit serially outputs the pulses.

In a display device including a source signal line driving circuit and a pixel portion both formed on a substrate, the driving circuit of a display device according to the fourth aspect of the present invention is characterized in that the source signal line driving circuit includes first to xth (x: natural number, $x \geq 2$) units, the cth (c: natural number, $1 \leq c < x$) unit includes a shift register for serially outputting pulses in accordance with clock signals, a plurality of level shifters for converting a voltage amplitude of input signals and the cth current source for supplying a current to the plurality of level shifters, and the cth current source supplies the current to the plurality of level shifters only during a part of the period in which the shift register in the c+1th unit serially outputs the pulses and only when the shift register in the cth unit serially outputs the pulses.

In a display device including a gate signal line driving circuit and a pixel portion both formed on a substrate, the driving circuit of a display device according to the fifth aspect of the present invention is characterized in that the gate signal line driving circuit includes a shift register for serially outputting pulses in accordance with clock signals, a level shifter for converting a voltage amplitude of input signals and a current source for supplying a current to the level shifter, and the current source supplies the current only when the shift register serially outputs the pulses.

In a display device including a gate signal line driving circuit and a pixel portion both formed on a substrate, the driving circuit of a display device according to the sixth aspect of the present invention is characterized in that the gate signal line driving circuit includes first to yth (y: natural number, $y \geq 2$) units, the dth unit (d: natural number, $1 \leq d \leq y$) includes a shift register for serially outputting pulses in accordance with clock signals, a plurality of level shifters for converting a voltage amplitude of input signals and the dth current source for supplying a current to the plurality of level shifters, and the dth current source supplies the current to the plurality of level shifters in the dth unit only when the shift register in the dth unit serially outputs the pulses.

In a display device including a gate signal line driving circuit and a pixel portion both formed on a substrate, the driving circuit of a display device according to the seventh aspect of the present invention is characterized in that the gate signal line driving circuit includes first to yth (y: natural number, $y \geq 2$) units, the eth unit (e: natural number, $1 < e \leq 7$) includes a shift register for serially outputting pulses in accordance with clock signals, a plurality of level shifters for converting a voltage amplitude of input signals and the eth current source for supplying a current to the plurality of level shifters, and the eth current source supplies the current to the plurality of level shifters in the eth unit during a part of the period in which the shift register in the e−1th unit serially outputs the pulses and only when the shift register in the eth unit serially outputs the pulses.

In a display device including a gate signal line driving circuit and a pixel portion both formed on a substrate, the driving circuit of a display device according to the eighth aspect of the present invention is characterized in that the gate signal line driving circuit includes first to yth (y: natural number, $y \geq 2$) units, the fth (f: natural number, $1 \leq f < y$) unit includes a shift register for serially outputting pulses in accordance with clock signals, a plurality of level shifters for converting a voltage amplitude of input signals and the fth current source for supplying a current to the plurality of level shifters, and the fth current source supplies the current to the plurality of level shifters in the fth unit during a part of the period in which the shift register in the f+1th unit serially outputs the pulses and only when the shift register in the fth unit serially outputs the pulses.

In a display device including a source signal line driving circuit and a pixel portion both formed on a substrate, the driving circuit of a display device according to the ninth aspect of the present invention is characterized in that the source signal line driving circuit includes a decoder for outputting pulses in accordance with input signals, a level shifter for converting a voltage amplitude of the input signals and a current source for supplying a current to the level shifter, and the current source supplies the current only when the decoder outputs the pulses.

In a display device including a source signal line driving circuit and a pixel portion both formed on a substrate, the driving circuit of a display device according to the tenth aspect of the present invention is characterized in that the source signal line driving circuit includes first to xth (x: natural number, $x \geq 2$) units, the ath (a: natural number, $1 \leq a \leq x$) unit includes a decoder for outputting pulses in accordance with input signals, a plurality of level shifters for converting a voltage amplitude of the input signals and the ath current source for supplying a current to the plurality of level shifters, and the ath current source supplies the current to the plurality of level shifters only when the decoder in the ath unit outputs the pulses.

In a display device including a source signal line driving circuit and a pixel portion both formed on a substrate, the driving circuit of a display device according to the eleventh aspect of the present invention is characterized in that the source signal line driving circuit includes first to xth (x: natural number, $x \geq 2$) units, the bth (b: natural number, $1 < b \leq x$) unit includes a decoder for outputting pulses in accordance with input signals, a plurality of level shifters for converting a voltage amplitude of the input signals and the bth current source for supplying a current to the plurality of level shifters, and the bth current source supplies the current to the plurality of level shifters in the bth unit only during a part of the period in which the decoder in the b−1th unit outputs the pulses and only when the decoder in the xth unit outputs the pulses.

In a display device including a source signal line driving circuit and a pixel portion both formed on a substrate, the driving circuit of a display device according to the twelfth aspect of the present invention is characterized in that the source signal line driving circuit includes first to xth (x: natural number, x≧2) units, the cth (c: natural number, 1≦c<x) unit includes a decoder for outputting pulses in accordance with input signals, a plurality of level shifters for converting a voltage amplitude of the input signals and the cth current source for supplying a current to the plurality of level shifters, and the cth current source supplies the current to the plurality of level shifters in the cth unit only during a part of the period in which the decoder in the c+1th unit outputs the pulses and only when the decoder in the cth unit outputs the pulses.

In a display device including a gate signal line driving circuit and a pixel portion both formed on a substrate, the driving circuit of a display device according to the thirteenth aspect of the present invention is characterized in that gate signal line driving circuit includes a decoder for outputting pulses in accordance with input signals, a level shifter for converting a voltage amplitude of the input signals and a current source for supplying a current to the level shifter, and the current source supplies the current only when the decoder outputs the pulses.

In a display device including a gate signal line driving circuit and a pixel portion both formed on a substrate, the driving circuit of a display device according to the fourteenth aspect of the present invention is characterized in that the gate signal line driving circuit includes first to yth (y: natural number, y≧2) units, the dth (d: natural number, 1≦d≦y) unit includes a decoder for outputting pulses in accordance with input signals, a plurality of level shifters for converting a voltage amplitude of the input signals and the dth current source for supplying a current to the plurality of level shifters, and the dth current source supplies the current to the plurality of level shifters only when the decoder in the dth unit outputs the pulses.

In a display device including a gate signal line driving circuit and a pixel portion both formed on a substrate, the driving circuit of a display device according to the fifteenth aspect of the present invention is characterized in that the gate signal line driving circuit includes first to yth (y: natural number, y≧2) units, the eth (e: natural number, 1<e≦y) unit includes a decoder for outputting pulses in accordance with input signals, a plurality of level shifters for converting a voltage amplitude of the input signals and the eth current source for supplying a current to the plurality of level shifters, and the eth current source supplies the current to the plurality of level shifters only during a part of the period in which the decoder in the e−1th unit outputs the pulses and only when the decoder in the eth unit outputs the pulses.

In a display device including a gate signal line driving circuit and a pixel portion both formed on a substrate, the driving circuit of a display device according to the sixteenth aspect of the present invention is characterized in that the gate signal line driving circuit includes first to yth (y: natural number, y≧2) units, the fth (e: natural number, 1≦f<y) unit includes a decoder for outputting pulses in accordance with input signals, a plurality of level shifters for converting a voltage amplitude of the input signals and the fth current source for supplying a current to the plurality of level shifters, and the fth current source supplies the current to the plurality of level shifters only during a part of the period in which the decoder in the f+1th unit outputs the pulses and only when the decoder in the fth unit outputs the pulses.

In a display device according to any of the first through sixteenth aspects, the driving circuit of a display device according to the seventeenth aspect of the present invention is characterized in that the source signal line driving circuit, the gate signal line driving circuit and the pixel portion are formed over any of a glass substrate, a plastic substrate, a stainless steel substrate and a single crystal wafer.

In a display device according to any of the first through seventeenth aspects, the driving circuit of a display device according to the eighteenth aspect of the present invention is characterized in that the driving circuit and the pixel portion are formed over the same substrate.

In a display device according to any of the first through seventeenth aspects, the driving circuit of a display device according to the nineteenth aspect of the present invention is characterized in that the driving circuit and the pixel portion are formed over different substrates.

BRIEF DESCRIPTION OF THE DRAWINGS

FIG. 5 shows an example of the construction of the driving circuit of the display device according to the present invention;

FIG. 6 shows another example of the construction of the driving circuit of the display device according to the present invention;

FIG. 7 shows another example of the construction of the driving circuit of the display device according to the present invention;

FIG. 9 is a schematic view of a driving circuit of a display device known prior to the present invention;

FIGS. 10(A) to 10(H) are circuit diagrams of level shifters and current sources;

FIGS. 11(A) to 11(C) show an example of a fabrication process of a display device;

FIGS. 12(A) to 12(C) show the example of the fabrication process of the display device;

FIGS. 13(A) to 13(C) show the example of the fabrication process of the display device;

FIG. 14 shows the example of the fabrication process of the display device;

FIGS. 16(A) to 16(C) show other examples of the electronic appliances to which the present invention is applied.

DESCRIPTION OF THE PREFERRED EMBODIMENTS

Basic Embodiment

Figure 1:
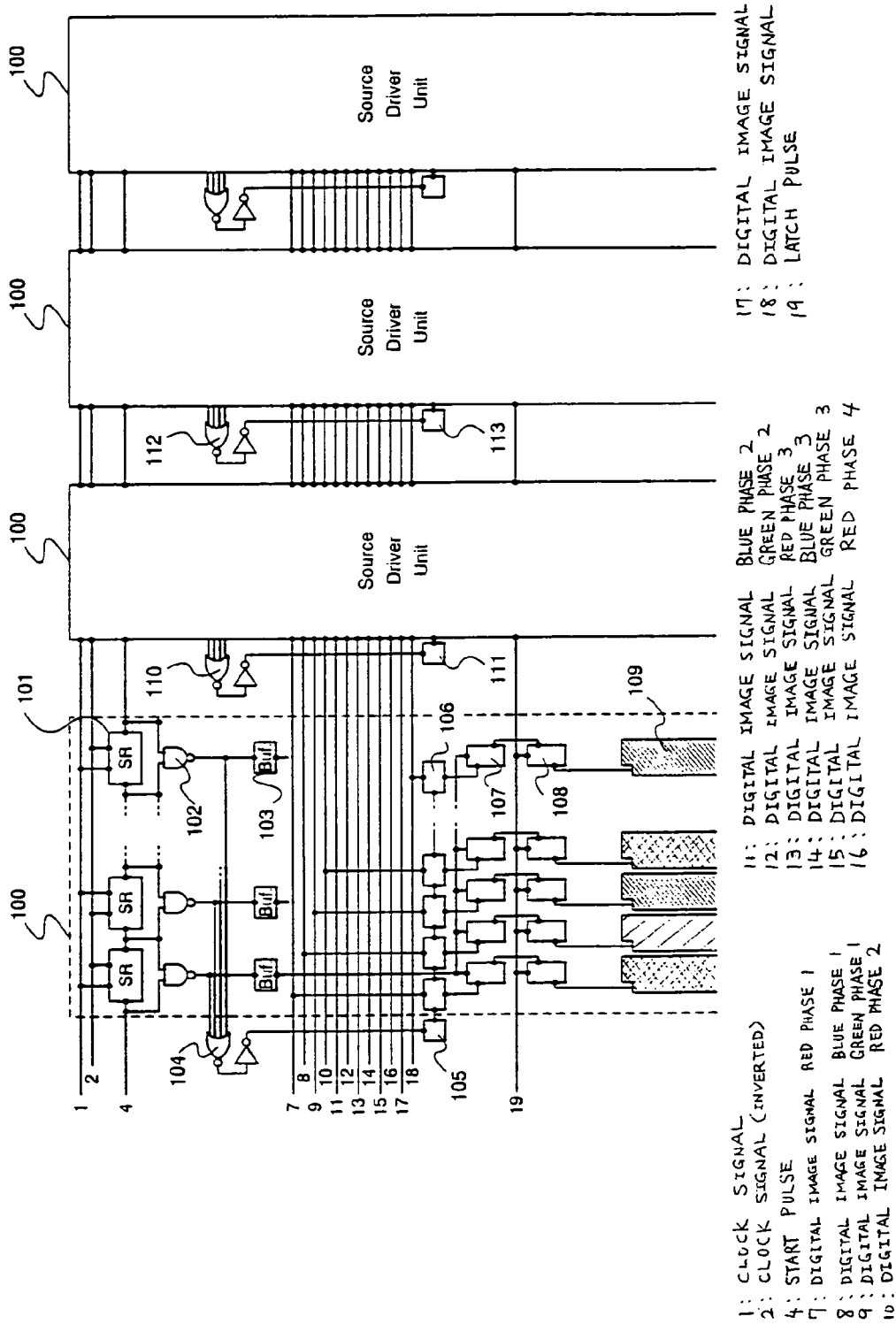
FIG. 1 is a schematic view of a driving circuit of a display device according to the present invention.
Figure 2:
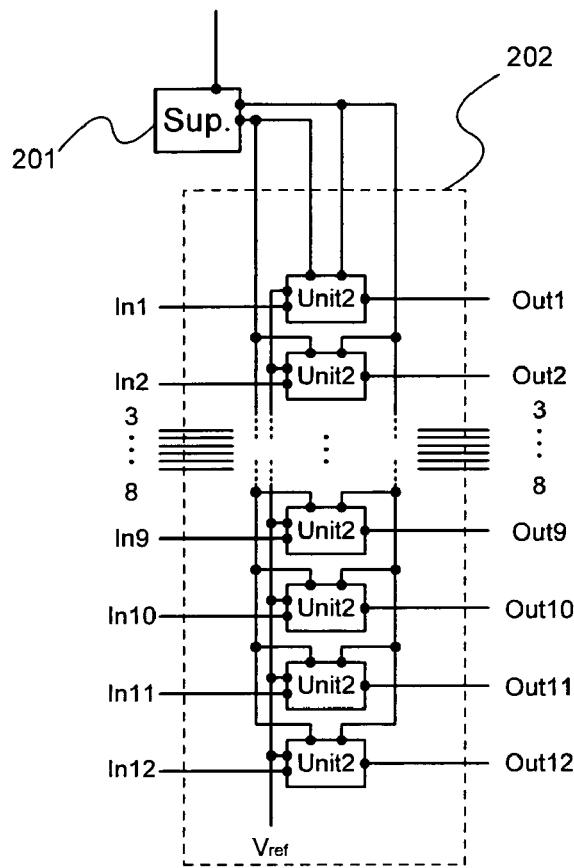
FIGS. 2(A) to 2(E) show a circuit diagram of a level shifter and a current source.
Figure 2:
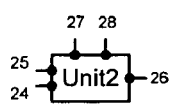
Figure 2:
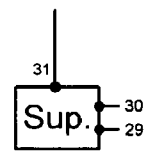
Figure 2:
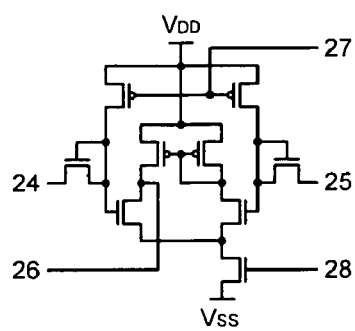
Figure 2:
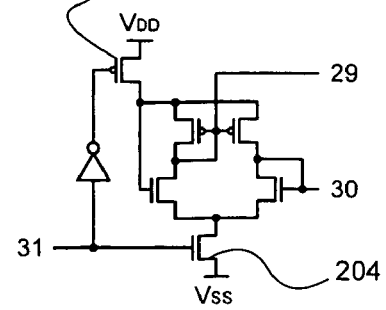

FIG. 1 shows a structural form of the driving circuit of the display device according to the present invention. A source signal line driving circuit is divided into a suitable number of stages, and a current source for a level shifter is disposed in the division unit (hereinafter merely called the "units"). The source signal line driving circuit comprises a plurality of stages of those units such as x stages as indicated by a frame of dotted line. In this instance, it is not always necessary to divide the number of stages of shifter registers per unit into equal segments such as [total number of shift register stages/ x]. The source signal line driving circuit includes shift registers 101, NAND circuits 102, buffers 103, NOR circuits 104, level shifter current sources 105, level shifters 106, first latch circuits 107, second latch circuit 108 and pixels 109.

The level shifter current source 105 and the level shifter 106 have the construction shown in FIGS. 2(A) to 2(E). The level shifter is of the type that executes level conversion of signals by utilizing a differential amplifier in the same way as the level shifter used in the source signal line driving circuit shown in FIG. 9. The level shifter current source 105 corresponds to a block indicated by reference numeral 201 in FIGS. 2(A) to 2(E). Only when a pulse is inputted to an input terminal 31, TFT 203 and 204 become conductive and the current source 105 can supply a current to each level shifter.

However, the present invention can be used for all the level shifters each having a current source. The construction of the level shifter is not particularly limited to this type and other types can likewise be used.

The signal inputted to the input terminal 31 is the one that is acquired by inversing the output pulse of the NOR circuit 104. The output pulse from the NAND circuit of each stage (first latch pulse) is inputted to the NOR circuit 104. In other words, in a certain unit, while the shift register of any one stage is operating, a pulse having a Hi potential is inputted to any of the input terminals of the NOR circuit 104, and the NOR circuit 104 outputs a pulse having a Lo potential. This pulse is inversed by an inverter, or the like, and is inputted to the input terminal 31 of the level shifter current source 105. The current source 105 supplies the current as described above. During the period in which the shift register stops its operation the Lo potential is inputted to all the input terminals of the NOR circuit 104 (or, the first latch pulse is not outputted). In consequence, the Lo potential is inputted to the input terminal 31 of the level shifter current source 105 and cuts off the current.

Figure 4:
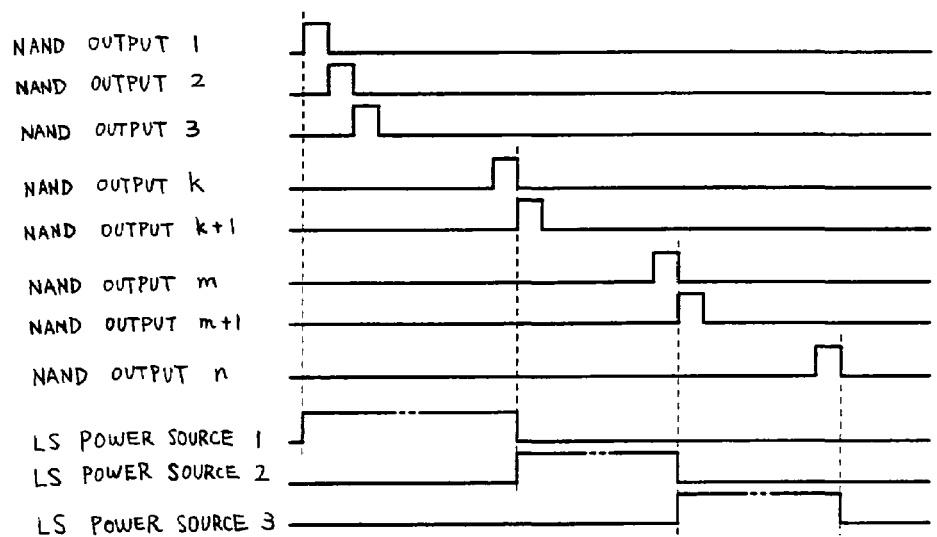
FIG. 4 shows an operation timing chart of the driving circuit of the display device.

The operation will be explained with reference to the timing chart shown in FIG. 4. The first unit includes the NAND circuits that output first latch pulses of the first to kth stages. The outputs of these NAND circuits are inputted to the NOR circuit 104 for controlling the level shifter current sources 105 connected to the first unit. The second unit includes the NAND circuits for outputting the first latch pulses of the k+1th to mth stages. The outputs of these NAND circuits are inputted to the NOR circuit 110 for controlling the level shifter current sources 105 connected to the second unit. The third unit includes the NAND circuits for outputting the first latch pulses of the m+1th to nth stages. The outputs of these NAND circuits are inputted to the NOR circuit 112 for controlling the level shifter current sources 113 connected to the third unit. Subsequently, a similar circuit arrangement is repeated to the final xth stage.

Since the pulses are serially inputted to the NOR circuit 104 during the period from the NAND output of the first stage to the NAND output of the kth stage, the current source 105 connected to the first unit (LS power source 1 in FIG. 4) supplies the current during this period. Here, the current is supplied to only the level shifters belonging to the first unit. After the NAND output of the kth stage is completed, the circuit from the shift register to the NAND circuit in the first unit does not operate. Therefore, all the inputs to the NOR circuit 104 fall to the Lo potential and cut off the current source 105.

Subsequently, the k+1th NAND circuit outputs the pulses. This k+1th NAND circuit belongs to the second unit and its output pulse is inputted to the NOR circuit 110 connected to the current source 111 (LS power source 2 in FIG. 4) that is in turn connected to the second unit, so that the supply of the current is started to only the level shifters belonging to the second unit. After the NAND output of the mth stage is completed, the circuit from the shift register to the NAND circuit in the second unit does not operate. Therefore, all the inputs to the NOR circuit 110 fall to the Lo potential and cut off the current source 111.

This procedure is repeated from the third unit to the final xth unit. Therefore, the current is supplied to the operating unit, that is, the unit containing the pulse output stage. Consequently, the current can be supplied to only the necessary portion in comparison with the case where the NOR circuit of one system is used to control the current source of the whole source signal line driving circuits.

The method described above can stop the supply of the constant current to the level shifter in the period in which no output exists from the shift register, and contributes to lower power consumption. When applied to Japanese Patent Application Nos. 2000-240332, 2000-249083, 2000-305642, etc, that accomplish lower power consumption by stopping a part of driving circuits at the time of still image display, in particular, the present invention can further reduce power consumption.

Incidentally, the present invention specifically explains level conversion of digital image signals in a source signal line driving circuit by way of example, but is not particularly limited thereto. The present invention can be applied to any display device that executes level conversion of each signal such as an input signal by use of a level shifter requiring a current source even when image signals are analog signals, too. It can be applied naturally to a gate signal line driving circuit.

The source signal line driving circuit illustrated in this basic embodiment is of the type in which the operation of the shift register serially outputs the pulses. However, the present invention can be easily applied not only to the shift register but also to driving circuits of other systems that execute selection by use of decoders, or the like.

Hereinafter, several embodiments of the present invention will be described.

Embodiment 1

Figure 3:
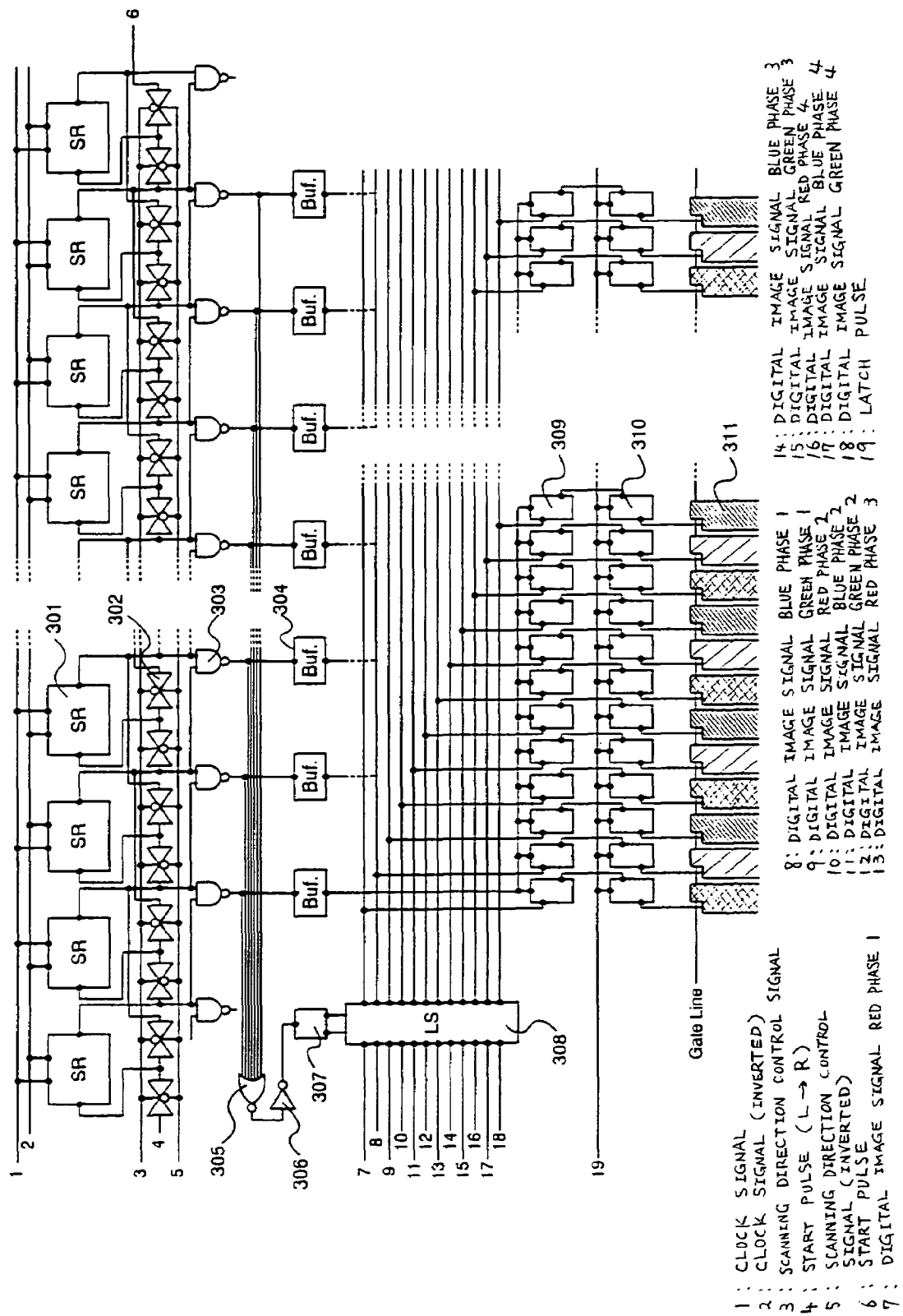
FIG. 3 shows an example of a construction of the driving circuit of the display device according to the present invention.

FIG. 3 shows a structural example of a source signal line driving circuit of a display device according to the present invention. The circuit includes shift registers 301, analog switches 302 for switching a scanning direction, NAND circuits 303, buffers 304, NOR circuits 305, inverters 306, level shifter current sources 307, level shifters 308, first latch circuits 309, second latch circuits 310 and pixels 311.

In this embodiment, the source signal line driving circuit is divided into a plurality of units. A current source is provided to each unit and only the current source in the operating unit supplies a current. However, a first latch pulse outputted from the NAND circuit is inputted to the NOR circuit to turn ON/OFF the operation of the current source without dividing the source signal line driving circuit into the units as in this embodiment. However, the NOR circuit 305 shown in FIG. 3 is merely a typical example. It is not realistic to use a NOR circuit having terminals to which output pulses of all stages are inputted. For this reason, a user can create the circuit by combining a plurality of NOR circuits and NAND circuits. In the circuit shown in this embodiment, the current source can be stopped during a retrace line period to stop the supply of the current.

Embodiment 2

The operation of the level shifter power source in the driving circuit in the basic embodiment and Embodiment 1 will be considered. The first latch pulse outputted from the NAND circuit is inputted to the first latch circuit through the buffer. At the same time, the first latch pulse is inputted to the NOR circuit. In consequence, the level shifter current source is turned ON and level conversion of a digital image signal is conducted. At this time, the ON timing of the level shifter current source is likely to be belated from the input timing of the latch pulse to the first latch circuit due to dullness of the shape of the pulse or its delay. In such a case, the supply of the current to the level shifter may not be made normally at the timing bridging a plurality of units. To practically apply the present invention to the driving circuit, the ON/OFF timing of the current source is preferably provided with a certain margin in view of the problem described above. This embodiment provides a circuit construction for solving such a problem.

Reference is to be had to FIG. 5. The basic embodiment and Example 1 use the NAND output for controlling the level shifter power source, that is, the input to the NOR circuit, whereas this embodiment uses the output from the shift register. As a structural example of the circuit, it is advisable to control the level shifter power source for each unit as shown in FIG. 6.

Figure 17:
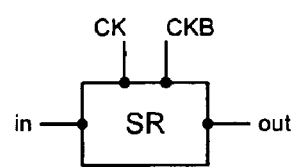
FIGS. 17(A) to 17(C) show an example of a shift register using a D flip-flop.
Figure 17:
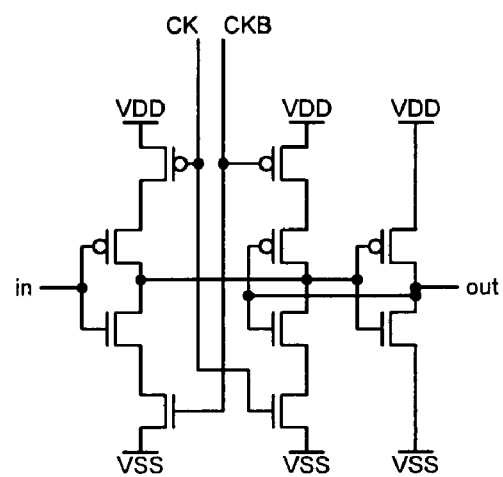
Figure 17:
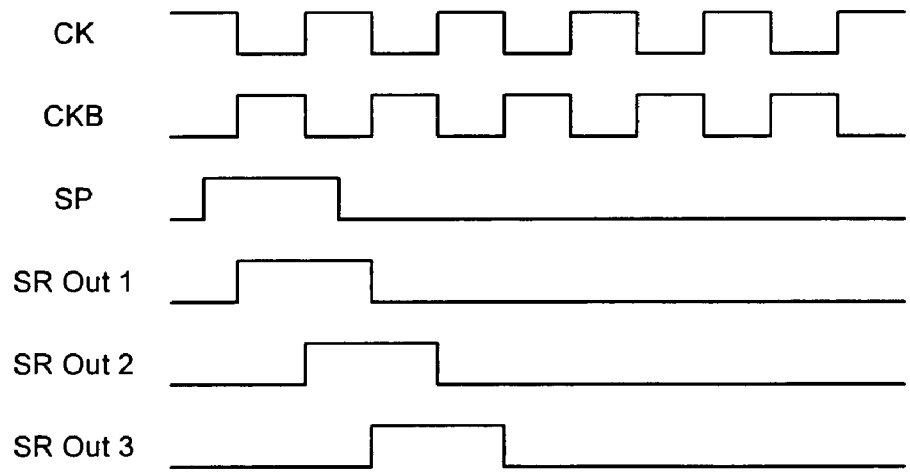

The shift register of the driving circuit of the embodiment shown in FIG. 6 uses an ordinary type such as a D flip-flop (D-FF) type shown in FIGS. 17(A) and 10(C). This D-FF holds the potential of the input terminal at the fall timing of the clock signal (CK) and remains under the holding state till the fall of the next clock signal. Therefore, the input/output becomes such as shown in FIG. 17(B). The output pulses have a pulse width twice that of the clock signal and are serially outputted. Each pulse overlaps with one another at its ½ pulse width.

Figure 8A:
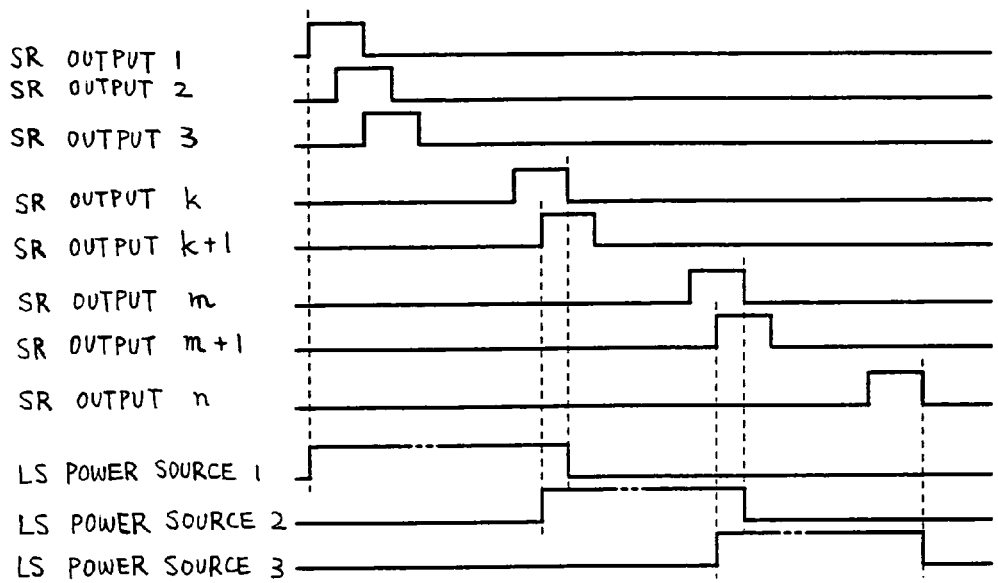
FIGS. 8(A) to 8(B) show operation timing charts of the driving circuit of the display device.

The shift register output inputted to the NAND circuit overlaps with the pulses of the adjacent stages as shown in the timing chart of FIG. 8(A). This has already been described with reference to FIGS. 17(A) to 17(C). The period in which the LS power source 1 is ON is the period from the timing at which the shift register of the first stage in the first unit outputs the pulse to the timing at which the pulse output from the shift register of the kth stage terminates. When the shift register of the k+1th stage of the subsequent second unit outputs the pulse, the LS power source 2 is turned ON. Here, since the output pulse of the shift register of the kth stage overlaps with the output pulse of the shift register of the k+1th stage, a period can be provided in which both LS power source 1 and LS power source 2 are kept ON. In other words, since the pulse of the final stage of ath unit (a: natural number, 1≦a≦x) overlaps with the pulse of the initial stage of the a1th unit, the current source of the ath unit and the current source of the a+1th unit supply the current during this period. In this way, the supply of the current can be made normally during the level conversion at the timing bridging each unit due to the delay of the pulse, etc, described above.

Embodiment 3

In this example, a method of supplying the current during level conversion at the timing bridging each unit, that is different from the method of Embodiment 2, will be explained.

To provide the overlapping period to the ON timing of the level shifter current source, Embodiment 2 employs means for using the output pulse from the shift register for the input to the NOR circuit. This embodiment uses the output pulse from the NAND circuit as the input to the NOR circuit in the same way as in the basic embodiment. However, this embodiment inputs the output pulse from the NAND circuit of the final stage of a preceding unit to the NOR circuit so as to provide the overlapping period to the ON timing of the level shifter current source.

Figure 8B:
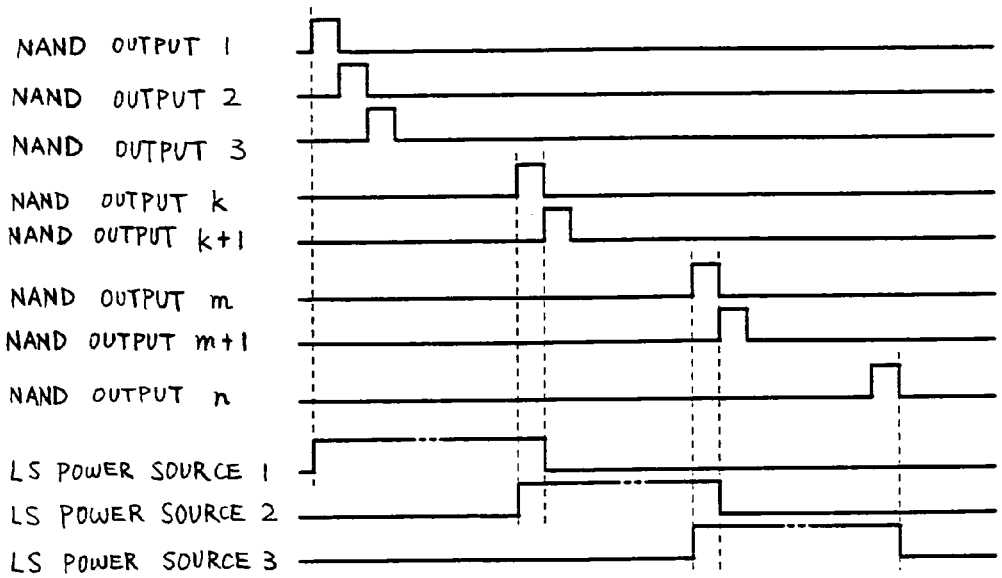

Reference is to be had to the circuit diagram in FIG. 7 and to the timing chart in FIG. 8(B). Let's consider the input to the NOR circuit 710 for controlling ON/OFF of the level shifter current source 711 connected to the second unit. The output of the NAND circuit 702 of the final stage of the preceding unit, that is, the first unit, is inputted to both NOR circuits 704 and 710. Therefore, both level shifter current sources 705 and 711 are ON at the timing at which the pulse is outputted from the NAND circuit 702.

The explanation will be given with reference to the timing chart. The NAND output of the final stage in the first unit is expressed as "NAND output k". The NAND output of the first stage in the second unit is expressed as "NAND output k+1". Here, the NAND output k is inputted to both the NOR circuit 704 for controlling ON/OFF of the level shifter current source 705 in the first unit and to the NOR circuit 710 for controlling ON/OFF of the level shifter current source 711 in the second unit. In consequence, both level shifter current sources 705 and 711 are turned ON. When the pulse of the final stage in the bth unit is inputted to the NOR circuit for controlling the level shifter current source in the b+1th unit, for example, the current sources of both bth unit (b: natural number, 1≦b≦x) and b+1th unit supply the current during this period. In this way, this embodiment can normally supply the current even during level conversion at the timing bridging each unit against the delay of the pulses described above by using a different method from the method of Embodiment 2.

Though this embodiment represents unidirectional scanning byway of example, it can be applied similarly to driving circuits capable of switching the scanning direction. The pulses may be acquired from the initial stage or the next stage of a subsequent unit. It is not particularly necessary to acquire only the pulse of the final stage of the preceding unit but other pulses may be acquired among the operations of the units.

Embodiment 4

In this embodiment, a method of simultaneously forming of TFTs of pixel portion and a driver circuit portion (source signal side driver circuit and gate signal side driver circuit) provided in a periphery of the pixel portion in the display device of the present invention is described. However, to simplify the explanation, CMOS circuit, which is a basic unit in relation to the driver circuit portion, is illustrated.

FIG. 11A is referred. First, in this embodiment, a substrate 5001 is used, which is made of glass such as barium borosilicate glass or aluminum borosilicate, represented by such as Corning #7059 glass and #1737 glass. Note that, as the substrate 5001, there is no limitation provided that it is a substrate with transmittance, and a quartz substrate may be used. A plastic substrate with heat resistance to a process temperature of this embodiment may also be used.

Then, a base film 5002 formed of an insulating film such as a silicon oxide film, a silicon nitride film or a silicon nitride oxide film is formed on the substrate 5001. In this embodiment, a two-layer structure is used as the base film 5002. However, a single-layer film or a lamination structure consisting of two or more layers of the insulating film may be used. As a first layer of the base film 5002, a silicon nitride oxide film 5002a is formed with a thickness of 10 to 200 nm (preferably 50 to 100 nm) with a plasma CVD method using SiH$_4$, NH$_3$, and N$_2$O as reaction gas. In this embodiment, the silicon nitride oxide film 5002a (composition ratio Si=32%, O=27%, N=24% and H=17%) with a film thickness of 50 nm is formed. Then, as a second layer of the base film 5002, a silicon nitride oxide film 5002b is formed and laminated into a thickness of 50 to 200 nm (preferably 100 to 150 nm) with a plasma CVD method using SiH$_4$ and N$_2$O as reaction gas. In this embodiment, the silicon nitride oxide film 5002b (composition ratio Si=32%, O=59%, N=7% and H=2%) with a film thickness of 100 nm is formed.

Subsequently, semiconductor layers 5003 to 5006 are formed on the base film. The semiconductor layers 5003 to 5006 are formed from a semiconductor film with an amorphous structure which is formed by a known method (such as a sputtering method, an LPCVD method, or a plasma CVD method), and is subjected to a known crystallization process (a laser crystallization method, a thermal crystallization method, or a thermal crystallization method using a catalyst such as nickel). The crystalline semiconductor film thus obtained is patterned into desired shapes to obtain the semiconductor layers. The semiconductor layers 5003 to 5006 are formed into the thickness of from 25 to 80 nm (preferably 30 to 60 nm). The material of the crystalline semiconductor film is not particularly limited, but it is preferable to be formed of silicon, a silicon germanium (Si$_x$Ge$_{1-x}$(X=0.0001 to 0.02)) alloy, or the like. In this embodiment, a 55 nm thick amorphous silicon film is formed by a plasma CVD method, and then, a nickel-containing solution is held on the amorphous silicon film. A dehydrogenation process of the amorphous silicon film is performed (500° C. for one hour), and thereafter a thermal crystallization process is performed (550° C. for four hours) thereto. Further, to improve the crystallinity thereof, a laser annealing treatment is performed to form the crystalline silicon film. Then, this crystalline silicon film is subjected to a patterning process using a photolithography method, to obtain the semiconductor layers 5003 to 5006.

Further, after the formation of the semiconductor layers 5003 to 5006, a minute amount of impurity element (boron or phosphorus) may be doped to control a threshold value of the TFT.

Besides, in the case where the crystalline semiconductor film is manufactured by the laser crystallization method, a pulse-oscillation type or continuous-wave type excimer laser, YAG laser, or YVO$_4$ laser may be used. In the case where those kinds of laser are used, it is appropriate to use a method in which laser light radiated from a laser oscillator is condensed by an optical system into a linear beam, and is irradiated to the semiconductor film. Although the conditions of the crystallization should be properly selected by an operator, in the case where the excimer laser is used, a pulse oscillation frequency is set as 30 Hz, and a laser energy density is set as 100 to 400 mJ/cm$^2$ (typically 200 to 300 mJ/cm$^2$). In the case where the YAG laser is used, it is appropriate that the second harmonic is used with a pulse oscillation frequency of 1 to 10 kHz and a laser energy density of 300 to 600 mJ/cm$^2$ (typically, 350 to 500 mJ/cm$^2$). Then, laser light condensed into a linear shape with a width of 100 to 1000 μm, for example, 400 μm is irradiated to the whole surface of the substrate, and an overlapping ratio (overlap ratio) of the linear laser light at this time may be set as 50 to 90%.

A gate insulating film 5007 is then formed for covering the semiconductor layers 5003 to 5006. The gate insulating film 5007 is formed of an insulating film containing silicon by a plasma CVD method or a sputtering method into a film thickness of from 40 to 150 nm. In this embodiment, the gate insulating film 5007 is formed of a silicon nitride oxide film into a thickness of 110 nm by a plasma CVD method (composition ratio Si=32%, O=59%, N=7%, and H=2%). Of course, the gate insulating film 5007 is not limited to the silicon nitride oxide film, and other insulating films containing silicon may be used as a single layer or a lamination structure.

Besides, when the silicon oxide film is used, it can be possible to be formed by a plasma CVD method in which TEOS (tetraethyl orthosilicate) and O$_2$ are mixed and discharged at a high frequency (13.56 MHZ) power density of 0.5 to 0.8 W/cm$^2$ with a reaction pressure of 40 Pa and a substrate temperature of 300 to 400° C. Good characteristics as the gate insulating film can be obtained in the manufactured silicon oxide film by subsequent thermal annealing at 400 to 500° C.

Then, on the gate insulating film 5007, a first conductive film 5008 with a thickness of 20 to 100 nm and a second conductive film 5009 with a thickness of 100 to 400 nm are formed and laminated. In this embodiment, the first conductive film 5007 of TaN film with a film thickness of 30 nm and the second conductive film 5008 of a W film with a film thickness of 370 nm are formed into lamination. The TaN film is formed by sputtering with a Ta target under a nitrogen containing atmosphere. Besides, the W film is formed by the sputtering method with a W target. The W film may be formed by a thermal CVD method using tungsten hexafluoride (WF$_6$). Whichever method is used, it is necessary to make the material have low resistance for use as the gate electrode, and it is preferred that the resistivity of the W film is set to less than or equal to 20 μΩcm. By making the crystal grains large, it is possible to make the W film have lower resistivity. However, in the case where many impurity elements such as oxygen are contained within the W film, crystallization is inhibited and the resistance becomes higher. Therefore, in this embodiment, by forming the W film by a sputtering method using a W target with a purity of 99.9999%, and in addition, by taking sufficient consideration to prevent impurities within the gas phase from mixing therein during the film formation, a resistivity of from 9 to 20 μΩcm can be realized.

Note that, in this embodiment, the first conductive film 5008 is made of TaN, and the second conductive film 5009 is made of W, but the material is not particularly limited thereto, and either film may be formed of an element selected from the group consisting of Ta, W, Ti, Mo, Al, Cu, Cr, and Nd, or an alloy material or a compound material containing the above element as its main constituent. Besides, a semiconductor film, typified by a polycrystalline silicon film doped with an impurity element such as phosphorus, may be used. Further, an AgPdCu alloy may be used. Besides, any combination may be employed such as a combination in which the first conductive film is formed of tantalum (Ta) and the second conductive film is formed of W, a combination in which the first conductive film is formed of titanium nitride (TiN) and the second conductive film is formed of W, a combination in which the first conductive film is formed of tantalum nitride (TaN) and the second conductive film is formed of Al, or a combination in which the first conductive film is formed of tantalum nitride (TaN) and the second conductive film is formed of Cu.

Next, as shown in FIG. 11C, mask 5010 made of resist are formed using a photolithography method, and a first etching process is performed in order to form electrodes and wirings. This first etching process is performed with the first and second etching conditions. In this embodiment, as the first etching conditions, an ICP (inductively coupled plasma)

etching method is used, a gas mixture of $CF_4$, $Cl_2$, $O_2$ is used as an etching gas, the gas flow rate is set to 25/25/10 sccm, and plasma is generated by applying a 500 W RF (13.56 MHZ) power to a coil shape electrode under 1 Pa. A dry etching device with ICP (Model E645-☐ICP) produced by Matsushita Electric Industrial Co. Ltd. is used here. A 150 W RF (13.56 MHZ) power is also applied to the substrate side (sample stage) to effectively apply a negative self-bias voltage. The W film is etched with the first etching conditions, and the end portion of the first conductive layer is formed into a tapered shape. In the first etching conditions, the etching rate for W is 200.39 nm/min, the etching rate for TaN is 80.32 nm/mmn, and the selectivity of W to TaN is about 2.5. Further, the taper angle of W is about 26° with the first etching conditions.

Thereafter, as shown in FIG. 11C, the first etching conditions are changed into the second etching conditions without removing the mask 5010 made of resist, a mixed gas of $CF_4$ and $Cl_2$ is used as an etching gas, the gas flow rate is set to 30/30 sccm, and plasma is generated by applying a 500 W RF (13.56 MHZ) power to a coil shape electrode under 1 Pa to thereby perform etching for about 30 seconds. A 20 W RF (13.56 MHZ) power is also applied to the substrate side (sample stage) to effectively apply a negative self-bias voltage. The W film and the TaN film are both etched on the same order with the second etching conditions in which $CF_4$ and $Cl_2$ are mixed. In the second etching conditions, the etching rate for W is 58.97 nm/min, and the etching rate for TaN is 66.43 nm/min. Note that, the etching time may be increased by approximately 10 to 20% in order to perform etching without any residue on the gate insulating film.

In the above-mentioned first etching process, the end portions of the first and second conductive layers are formed to have a tapered shape due to the effect of the bias voltage applied to the substrate side by adopting masks of resist with a suitable shape. The angle of the tapered portions may be set to 15° to 45°. Thus, first shape conductive layers 5011 to 5015 (first conductive layers 5011a to 5015a and second conductive layers 5011b to 5015b) constituted of the first conductive layers and the second conductive layers are formed by the first etching process. Reference numeral 5007 denotes a gate insulating film, and regions of the gate insulating film which are not covered by the first shape conductive layers 5011 to 5015 are made thinner by approximately 20 to 50 nm by etching.

Then, a first doping process is performed to add an impurity element for imparting an n-type conductivity to the semiconductor layer without removing the mask made of resist (FIG. 5B). Doping may be carried out by an ion doping method or an ion injecting method. The condition of the ion doping method is that a dosage is $1 \times 10^{13}$ to $5 \times 10^{15}$ atoms/$cm^2$, and an acceleration voltage is 60 to 100 keV. In this embodiment, the dosage is $1.5 \times 10^{15}$ atoms/$cm^2$ and the acceleration voltage is 80 keV. As the impurity element for imparting the n-type conductivity, an element that belongs to group 15 of the periodic table, typically phosphorus (P) or arsenic (As) is used, and phosphorus (P) is used here. In this case, the conductive layers 5011 to 5015 become masks to the impurity element for imparting the n-type conductivity, and high concentration impurity regions 5016 to 5019 are formed in a self-aligning manner. The impurity element for imparting the n-type conductivity is added to the high concentration impurity regions 5016 to 5019 in the concentration range of $1 \times 10^{20}$ to $1 \times 10^{21}$ atoms/$cm^3$.

Thereafter, the second etching process is performed without removing the masks made of resist as shown in FIG. 11C. Here, a mixed gas of $CF_4$, $Cl_2$ and $O_2$ is used as an etching gas, the gas flow rate is set to 20/20/20 sccm, and plasma is generated by applying a 500 W RF (13.56 MHZ) power to a coil shape electrode under 1 Pa to thereby perform etching. A 20 W RF (13.56 MHZ) power is also applied to the substrate side (sample stage) to effectively apply a negative self-bias voltage. In the second etching process, the etching rate for W is 124.62 nm/min, the etching rate for TaN is 20.67 nm/min, and the selectivity of W to TaN is 6.05. Accordingly, the W film is selectively etched. The taper angle of W is 70° in the second etching. Second conductive layers 5020b to 5024b are formed by the second etching process. On the other hand, the first conductive layers 5011a to 5015a are hardly etched, and first conductive layers 5020a to 5024a are formed.

Next, a second doping process is performed. Second conductive layers 5020b to 5024b are used as masks to an impurity element, and doping is performed such that the impurity element is added to the semiconductor layer below the tapered portions of the first conductive layers. In this embodiment, phosphorus (P) is used as the impurity element, and plasma doping is performed with the dosage of $1.5 \times 10^{14}$ atoms/$cm^2$, the current density 0.5 µA and the acceleration voltage of 90 keV. Thus, low concentration impurity regions 5025 to 5028, which overlap with the first conductive layers, are formed in a self-aligning manner. The concentration of phosphorus (P) in the low concentration impurity regions 5025 to 5028 is $1 \times 10^{17}$ to $5 \times 10^{18}$ atoms/$cm^3$, and has a gentle concentration gradient in accordance with the film thickness of the tapered portions of the first conductive layers. Note that, in the semiconductor layer that overlaps with the tapered portions of the first conductive layers, the concentration of the impurity element slightly falls from the end portions of the tapered portions of the first conductive layers toward the inner portions. The concentration, however, keeps almost the same level. Further, the impurity element is added to the high concentration impurity regions 5016 to 5019 to form high concentration impurity regions 5016 to 5019. (FIG. 12A)

Next, the resist mask is removed as shown in FIG. 12(B). The third etching process is then conducted by photolithography. This third etching process is conducted to locally etch the taper portion of the first conductor layer and to etch it into the shape overlapping with the second conductor layer. However, a mask made of a resist 5029 is formed on regions where third etching is not conducted.

The etching condition of the third etching process is as follows. The etching gas is $Cl_2$ and $SF_6$ and the gas flow rate ratio is 10/50 sccm. Third etching is conducted by the ICP etching process in the same way as in the first and second etching processes. The etching rate to TaN in the third etching process is 111.2 nm/min, and the etching rate to the gate insulating film is 12.8 nm/min.

In this embodiment, etching is conducted while 500 W RF power (13.56 MHz) is applied to a coil-shaped electrode at a pressure of 1.3 Pa to generate plasma. At the same time, 10 W RF power (13.56 MHz) is also applied to the substrate side (sample stage) to apply a substantially negative bias voltage. In this way are formed the first conductor layers 5030a to 5032a.

As a result of third etching described above, impurity regions (LDD regions) 5033 to 5034 not overlapping with the first conductor layers 5030a to 5032a are formed. Incidentally, the impurity regions (GOLD regions) 5025 and 5028 remain overlapping with the first conductor layers 5020a and 5024a, respectively.

In the manner described above, this embodiment can simultaneously form the impurity regions (LDD regions) not overlapping with the first conductor layers and the impurity regions (GOLD regions) 5025 and 5028 overlapping with the first conductor layers, and can therefore form assorted regions in accordance with the TFT characteristics.

Next, after the resist mask is removed, the gate insulating film 5007 is etched. This etching process uses $CHF_3$ for the etching gas and is conducted by a reactive ion etching method (RIE method). In this embodiment, third etching is conducted at a chamber pressure of 6.7 Pa, RF power of 800 W, and a $CHF_3$ gas flow rate of 35 sccm. As a result, a part of the high concentration impurity regions 5016 to 5019 is exposed, giving gate insulating films 5007a to 5007d.

Next, a new resist mask 5035 is formed and a third doping process is conducted. This third doping process forms an impurity region 5036 (FIG. 12(C)) containing an impurity element, that imparts a second conductivity type (p type) opposite to the first conductivity type (n type), in the semiconductor layer to serve as the active layer of the p channel TFT. An impurity element imparting the p type is doped by use of the first conductor layer 5030a as the mask to the impurity element to form the impurity region in self-alignment.

In this embodiment, the ion doping process using diborane ($B_2H_6$) is employed to form the impurity region 5036. In this third doping process, the semiconductor layer for forming the n channel TFT is covered with the mask made of the resist. The first and second doping processes add phosphorus in mutually different concentrations into the impurity region 5036. However, the doping process is carried out so that the concentration of the impurity element for imparting the p type attains $2 \times 10^{20}$ to $2 \times 10^{21}$ atoms/cm$^3$ in any region. In consequence, no problem occurs in the function of the source region and the drain region of the p channel TFT.

The process steps described so far form the impurity regions in the respective semiconductor layers. Incidentally, this embodiment represents the method of doping the impurity (B) after the gate insulating film is etched, but doping of the impurity may well be conducted without etching the gate insulating film.

Next, after the resist mask 5035 is removed, a first inter-layer insulating film 5037 is formed as shown in FIG. 13(A). A silicon-containing insulating film is formed to a thickness of 100 to 200 nm by plasma CVD or sputtering to give the first inter-layer insulating film 5037. This embodiment employs plasma CVD and forms a silicon oxide nitride film having a thickness of 150 nm. Needless to say, the first inter-layer insulating film 5037 is not limited to the silicon oxide nitride film, and a single layered film or a multi-layered film of other silicon-containing films may be used, as well.

Next, the activation process for activating the impurity elements added to the respective semiconductor layers is carried out. A thermal annealing process using an annealing furnace is used to conduct this activation step. This thermal annealing may be conducted in a nitrogen atmosphere having an oxygen concentration of not higher than 1 ppm, preferably not higher than 0.1 ppm, at 400 to 700° C., typically 500 to 550° C., for 4 hours. In this embodiment, activation process is conducted at 550° C. for 4 hours. Besides thermal annealing, it is possible to employ laser annealing or rapid thermal annealing (RTA).

In this embodiment, nickel (Ni) used as the crystallization catalyst is gettered in the impurity region containing high concentration P simultaneously with the activation process described above, thereby lowering the nickel concentration in the semiconductor layer to serve mainly as the channel formation region. Since the TFT having the channel formation region thus fabricated has a lower OFF current value and excellent crystallinity, it provides high field effect mobility and can accomplish satisfactory characteristics.

The activation process may well be carried out before the first inter-layer insulating film 5037 is formed. When the wiring material used is not highly resistant to heat, however, the activation process is preferably carried out after the inter-layer insulating film 5037 (an insulating film made of silicon as the principal component, such as a silicon nitride film) is formed as in this embodiment to protect the lead wires.

It is also possible to form the first inter-layer insulating film 5037 by conducting doping after the activation process is conducted.

Furthermore, heat-treatment is conducted in an atmosphere containing 3 to 100% hydrogen at 300 to 550° C. for 1 to 12 hours to hydrogenate the semiconductor layer. In this embodiment, heat-treatment is conducted at 410° C. for 1 hour in a nitrogen atmosphere containing about 3% hydrogen. This process step is the one that terminates the dangling bonds of the semiconductor layer by means of hydrogen contained in the inter-layer insulating film 5037. Plasma hydrogenation (using hydrogen that is excited by plasma) may be used as another hydrogenation means.

When laser annealing is used for the activation process, it is preferred to irradiate a laser beam such as excimer laser or YAG laser after hydrogenation is conducted.

Next, a second inter-layer insulating film 5038 made of an organic insulating material is formed over the first inter-layer insulating film 5037 as shown in FIG. 13(B). In this embodiment, a 1.6 μm-thick acrylic resin film is formed. Next, patterning is conducted to form contact holes reaching each impurity region 5016, 5018, 5019 and 5036.

A film made of a silicon-containing insulating material or an organic resin is used for the second inter-layer insulating film 5038. Silicon oxide, silicon nitride and silicon oxide nitride can be used as the silicon-containing insulating film. Resins such as polyimide, polyamide, acryl and BCB (benzocyclobutene) can be used for the organic resin.

This embodiment employs the plasma CVD process to form the silicon oxide nitride film. The film thickness of the silicon oxide nitride film is preferably 1 to 5 μm (further preferably 2 to 4 μm).

Dry etching or wet etching can be employed to form the contact holes. However, wet etching is preferred in view of the problem of dielectric breakdown during etching.

The first inter-layer insulating film 5037 and the second inter-layer insulating film 5038 are simultaneously etched during the formation of the contact holes. When the shape of the contact holes is taken into consideration, the material for forming the second inter-layer insulating film 5038 preferably has a higher etching rate than that of the material for forming the first inter-layer insulating film 5037.

Lead wires 5039 to 5044 to be electrically connected to the impurity regions 5016, 5018, 5019 and 5036 are formed next. A laminate film of a 50 nm-thick Ti film and 500 nm-thick alloy film (Al—Ti alloy film) is patterned to form the lead wires in this embodiment, but other electrically conductive films may be used, too.

In the manner described above, the driving circuit having n channel TFT and p channel TFT and the pixel portion having pixel TFT and holding capacitances can be formed over the same substrate. In this specification, such a substrate is referred to as an "active matrix substrate".

As to the holding capacitance, doping of the impurity may be selectively conducted to the necessary portions to form the capacitance before the gate conductor film is formed. According to this method, the number of photoresist masks increases by one, but the holding capacitance can be formed without applying a bias.

Subsequently, the third inter-layer insulating film 5045 is formed. This process is directed to planarize the TFT formation plane in order to form pixel electrodes. Therefore, the third inter-layer insulating film 5045 preferably consists of an insulating film having high planarity such as an acrylic resin film. Next, an MgAg film is formed on the insulating film and is then patterned to give the pixel electrodes (reflection electrodes) 5046 (FIG. 13(C)).

On the other hand, an opposing substrate 5047 is prepared. As shown in FIG. 14, color filter layers 5048 to 5050 and an overcoat layer 5051 are formed over the opposing substrate 5047. Color filters 5048 and 5049 having different colors are superposed to form the color filter layers over the TFT and serve also as a shading film. The color filter layer of each color uses a mixture of the resin with a pigment and has a thickness of 1 to 3 μm. A photosensitive material can be shaped into a predetermined pattern using a mask. At the same time, this color filter layer is utilized to form a spacer (not shown). The color filters are superposed to form this spacer. The height of the spacer is 2 to 7 μm, preferably 4 to 6 μm, when the thickness of the overcoat layer 5051, i.e. 1 to 4 μm, is taken into consideration. This height provides a gap when the active matrix substrate and the opposing substrate are bonded together. The overcoat layer 5051 is made of a photo-setting or thermo-setting type organic resin material such as a polyimide resin or an acrylic resin.

After the overcoat layer 5051 is formed, opposing electrodes 5052 made of a transparent conductor film are patterned. Thereafter, orientation films 5053 are formed over the active matrix substrate and the opposing substrate, and rubbing is carried out.

Thereafter, the active matrix substrate and the opposing substrate are bonded to each other with a sealant 5055. The sealant 5055 contains filler, and the filler and the spacer make it possible to bond the two substrates with a uniform gap between them. Subsequently, a liquid crystal material 5054 is filled between both substrates and is completely sealed by a sealant (not shown). The liquid crystal material 5054 can use known liquid crystal materials. The active matrix type liquid crystal display device shown in FIG. 14 can thus be completed.

The TFT in the active matrix type liquid crystal display device fabricated by the process steps described above assumes the top gate structure, but this embodiment can be likewise applied easily to TFT of a bottom gate structure or other structures. A transmission type display device can be acquired when the pixel electrodes are made of a transparent conductor film.

Though this embodiment uses the glass substrate, it can use substrates other than the glass substrate such as a plastic substrate, a stainless steel substrate, a single crystal wafer, and so forth.

Embodiment 5

The display device of the present invention has various usages. In this embodiment, the application example of electronic devices incorporating the display device of the present intention is explained.

The following can be given as examples of such electronic devices: a portable information terminal (such as an electronic book, a mobile computer, a mobile telephone); a video camera; a digital camera; a personal computer; a television and a projector device and like that. Examples of these electronic devices are shown in FIGS. 15A to 16C.

Figure 15A:
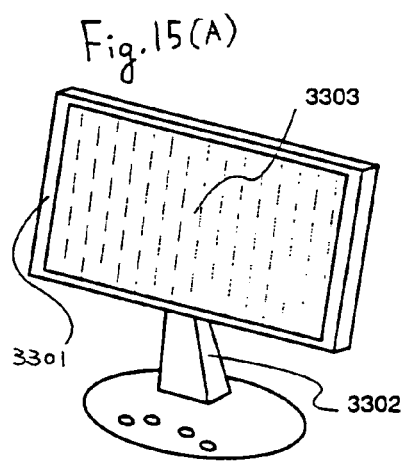
FIGS. 15(A) to 15(D) show examples of electronic appliances to which the present invention is applied.

FIG. 15A is a liquid crystal display (LCD), containing a casing 3301, a support stand 3302, and a display portion 3303. The display device of the present invention can be used in the display portion 3303.

Figure 15B:
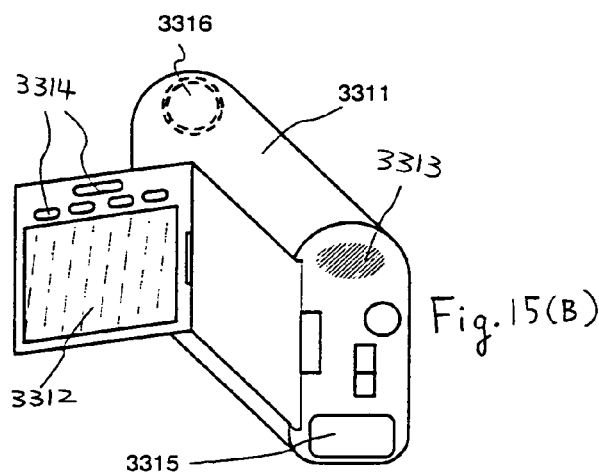

FIG. 15B is a video camera, containing a main body 3311, a display portion 3312, an audio input portion 3313, operation switches 3314, a battery 3315, and an image receiving portion 3316. The display device of the present invention can be used in the display portion 3312.

Figure 15C:
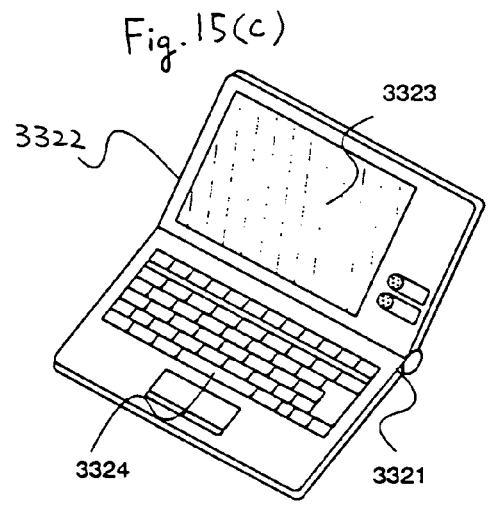

FIG. 15C is a personal computer, containing a main body 3321, a casing 3322, a display portion 3323, and a keyboard 3324. The display device of the present invention can be used in the display portion 3323.

Figure 15D:
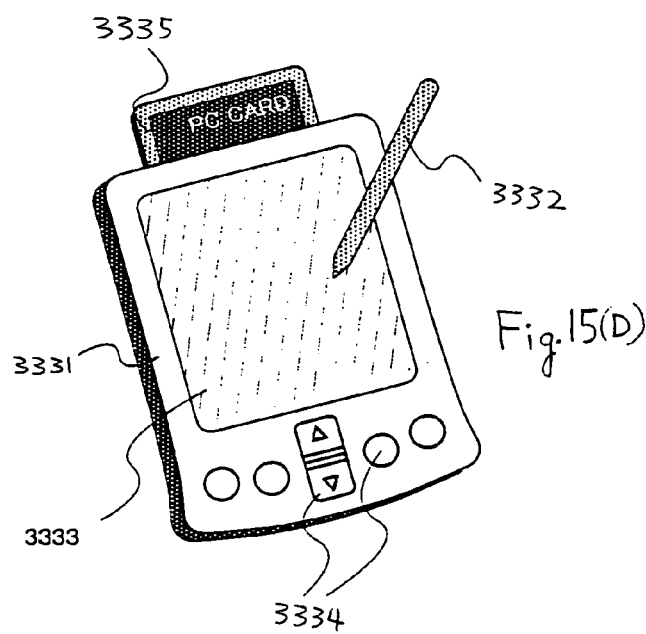

FIG. 15D is a portable information terminal, containing a main body 3331, a stylus 3332, a display portion 3333, an operation button 3334, and an external interface 3335. The display device of the present invention can be used in the display portion 3333.

FIG. 16A is a mobile telephone, containing a main body 3401, an audio output portion 3402, an audio input portion 3403, a display portion 3404, operation switches 3405, and an antenna 3406. The display device of the present invention can be used in the display portion 3404.

FIG. 16B is an audio reproducing device, specifically a car audio system, containing a main body 3411, a display portion 3412, and operation switches 3413 and 3414. The display device of the present invention can be used in the display portion 3412. Furthermore, an audio reproducing device for a car is shown in Embodiment 5, but it may also be used for a mobile type and a domestic type of audio reproducing device.

FIG. 16C is a digital camera, containing a main body 3501, a display device (A) 3502, a view finder 3503, an operation switches 3504, a display portion (B) 3505 and a battery 3506. The device of the present invention can be used in the display device (A) 3502 and a display portion (B) 3505.

The range of applications of the present invention is thus extremely wide, and it is possible to apply the present invention to electronic devices in all fields. Furthermore, any constitution of the display device shown in Embodiments 1 to 4 may be employed in the electronic devices of Embodiment 5.

The present invention can provide a driving circuit of a display device that can cope with a constant driving voltage of an external controller LSI, etc, and can attain lower power consumption.

What is claimed is:
1. A display device comprising:
a pixel portion; and
a source signal line driving circuit comprising:
  a first unit comprising:
    a plurality of first latch circuits;
    a plurality of first stages of a shift register which output pulses in accordance with clock signals, wherein the pulses decide timing of latching of the plurality of first latch circuits;
    a plurality of first level shifters for executing level conversion of signals inputted into the plurality of first latch circuits; and
    a first current source for controlling supply of current to the plurality of first level shifters; and
  a second unit comprising:
    a plurality of second latch circuits;
    a plurality of second stages of the shift register which output pulses in accordance with the clock signals, wherein the pulses decide timing of latching of the plurality of second latch circuits; and a plurality of second level shifters for executing level conversion of signals inputted into the plurality of second latch circuits;
a second current source for controlling supply of current to the plurality of second level shifters,
wherein the first current source is configured to stop supply of currents to the plurality of first level shifters while the plurality of second stages of the shift register output the pulses, and
wherein the second current source is configured to stop supply of currents to the plurality of second level shifters while the plurality of first stages of the shift register output the pulses.

2. A display device according to claim 1, wherein said source signal line driving circuit and said pixel portion are provided over a member selected from the group consisting of a glass substrate, a plastic substrate, a stainless steel substrate and a single crystal wafer.

3. A display device according to claim 1, wherein said source signal line driving circuit and said pixel portion are provided over a same substrate.

4. A display device according to claim 1, wherein said source signal line driving circuit and said pixel portion are provided over different substrates.

5. A display device according to claim 1, wherein said display device is a liquid crystal display device.

6. A display device according to claim 1, wherein said display device is incorporated into a personal computer.

7. A display device according to claim 1, wherein said display device is incorporated into a portable information terminal.

8. A display device according to claim 1, wherein said display device is incorporated into a car audio set.

9. A display device according to claim 1, wherein said display device is incorporated into a digital camera.

10. A display device according to claim 1, wherein said source signal line driving circuit comprises thin film transistors.

11. A display device comprising:
a pixel portion; and
a source signal line driving circuit comprising:
first to x-th (x: natural number x≧2) units, each of the first to x-th units comprising:
a plurality of latch circuits;
a plurality of stages of a shift register which output pulses in accordance with clock signals, wherein the pulses decide timing of latching of the plurality of latch circuits;
a plurality of level shifters for executing level conversion of signals inputted into the plurality of latch circuits, and
a current source for controlling supply of current to the plurality of level shifters,
wherein the current source in one unit is configured to stop supply of currents to the plurality of level shifters while the plurality of stages of the shift register in the other units output the pulses.

12. A display device according to claim 11, wherein said source signal line driving circuit and said pixel portion are provided over a member selected from the group consisting of a glass substrate, a plastic substrate, a stainless steel substrate and a single crystal wafer.

13. A display device according to claim 11, wherein said source signal line driving circuit and said pixel portion are provided over a same substrate.

14. A display device according to claim 11, wherein said source signal line driving circuit and said pixel portion are provided over different substrates.

15. A display device according to claim 11, wherein said display device is a liquid crystal display device.

16. A display device according to claim 11, wherein said display device is incorporated into a personal computer.

17. A display device according to claim 11, wherein said display device is incorporated into a portable information terminal.

18. A display device according to claim 11, wherein said display device is incorporated into a car audio set.

19. A display device according to claim 11, wherein said display device is incorporated into a digital camera.

20. A display device according to claim 11, wherein said source signal line driving circuit comprises thin film transistors.

21. A display device comprising:
a pixel portion; and
a source signal line driving circuit comprising:
a first unit comprising:
a plurality of first latch circuits;
a plurality of first stages of a decoder which output pulses in accordance with input signals, wherein the pulses decide timing of latching of the plurality of first latch circuits;
a plurality of first level shifters for executing level conversion of signals inputted into the plurality of first latch circuits; and
a first current source for controlling supply of current to the plurality of first level shifters; and
a second unit comprising:
a plurality of second latch circuits;
a plurality of second stages of the decoder which output pulses in accordance with the input signals, wherein the pulses decide timing of latching of the plurality of second latch circuits;
a plurality of second level shifters for executing level conversion of signals inputted into the plurality of second latch circuits, and
a second current source for controlling supply of current to the plurality of second level shifters,
wherein the first current source is configured to stop supply of currents to the plurality of first level shifters while the plurality of second stages of the decoder output the pulses, and
wherein the second current source is configured to stop supply of currents to the plurality of second level shifters while the plurality of first stages of the decoder output the pulses.

22. A display device according to claim 21, wherein said source signal line driving circuit and said pixel portion are provided over a member selected from the group consisting of a glass substrate, a plastic substrate, a stainless steel substrate and a single crystal wafer.

23. A display device according to claim 21, wherein said source signal line driving circuit and said pixel portion are provided over a same substrate.

24. A display device according to claim 21, wherein said source signal line driving circuit and said pixel portion are provided over different substrates.

25. A display device according to claim 21, wherein said display device is a liquid crystal display device.

26. A display device according to claim 21, wherein said display device is incorporated into a personal computer.

27. A display device according to claim 21, wherein said display device is incorporated into a portable information terminal.

28. A display device according to claim 21, wherein said display device is incorporated into a car audio set.

29. A display device according to claim 21, wherein said display device is incorporated into a digital camera.

30. A display device according to claim 21, wherein said source signal line driving circuit comprises thin film transistors.

31. A display device comprising:
a pixel portion; and
a source signal line driving circuit comprising:
first to x-th (x: natural number, x≧2) units, each of the first to x-th units comprising:
a plurality of latch circuits;
a plurality of stages of a decoder which output pulses in accordance with input signals, wherein the pulses decide timing of latching of the plurality of latch circuits;
a plurality of level shifters for executing level conversion of signals inputted into the plurality of latch circuits; and
a current source for controlling supply of current to the plurality of level shifters,
wherein the current source in one unit is configured to stop supply of currents to the plurality of level shifters while the plurality of stages of the decoder in the other units output the pulses.

32. A display device according to claim 31, wherein said source signal line driving circuit and said pixel portion are provided over a member selected from the group consisting of a glass substrate, a plastic substrate, a stainless steel substrate and a single crystal wafer.

33. A display device according to claim 31, wherein said source signal line driving circuit and said pixel portion are provided over a same substrate.

34. A display device according to claim 31, wherein said source signal line driving circuit and said pixel portion are provided over different substrates.

35. A display device according to claim 31, wherein said display device is a liquid crystal display device.

36. A display device according to claim 31, wherein said display device is incorporated into a personal computer.

37. A display device according to claim 31, wherein said display device is incorporated into a portable information terminal.

38. A display device according to claim 31, wherein said display device is incorporated into a car audio set.

39. A display device according to claim 31, wherein said display device is incorporated into a digital camera.

40. A display device according to claim 31, wherein said source signal line driving circuit comprises thin film transistors.

41. A semiconductor device comprising:
a first unit comprising:
a plurality of first latch circuits;
a plurality of first stages of a shift register which output pulses in accordance with clock signals, wherein the pulses decide timing of latching of the plurality of first latch circuits;
a plurality of first level shifters for executing level conversion of signals inputted into the plurality of first latch circuits; and
a first current source for controlling supply of current to the plurality of first level shifters; and
a second unit comprising:
a plurality of second latch circuits;
a plurality of second stages of the shift register which output pulses in accordance with the clock signals, wherein the pulses decide timing of latching of the plurality of second latch circuits;
a plurality of second level shifters for executing level conversion of signals inputted into the plurality of second latch circuits;
a second current source for controlling supply of current to the plurality of second level shifters,
wherein the first current source is configured to stop supply of currents to the plurality of first level shifters while the plurality of second stages of the shift register output the pulses, and
wherein the second current source is configured to stop supply of currents to the plurality of second level shifters while the plurality of first stages of the shift register output the pulses.

42. A semiconductor device according to claim 41, wherein said semiconductor device is a liquid crystal display device.

43. A semiconductor device according to claim 41, wherein said display device is incorporated into a personal computer.

44. A semiconductor device according to claim 41, wherein said display device is incorporated into a portable information terminal.

45. A semiconductor device according to claim 41, wherein said display device is incorporated into a car audio set.

46. A semiconductor device according to claim 41, wherein said display device is incorporated into a digital camera.

47. A semiconductor device comprising:
first to x-th (x: natural number, x≧2) units, each of the first to x-th units comprising:
a plurality of latch circuits;
a plurality of stages of a shift register which output pulses in accordance with clock signals, wherein the pulses decide timing of latching of the plurality of latch circuits;
a plurality of level shifters for executing level conversion of signals inputted into the plurality of latch circuits; and
a current source for controlling supply of current to the plurality of level shifters,
wherein the current source in one unit is configured to stop supply of currents to the plurality of level shifters while the plurality of stages of the shift register in the other units output the pulses.

48. A semiconductor device according to claim 47, wherein said semiconductor device is a liquid crystal display device.

49. A semiconductor device according to claim 47, wherein said display device is incorporated into a personal computer.

50. A semiconductor device according to claim 47, wherein said display device is incorporated into a portable information terminal.

51. A semiconductor device according to claim 47, wherein said display device is incorporated into a car audio set.

52. A semiconductor device according to claim 47, wherein said display device is incorporated into a digital camera.

53. A semiconductor device comprising:
a first unit comprising:
a plurality of first latch circuits;
a plurality of first stages of a decoder which output pulses in accordance with input signals, wherein the pulses decide timing of latching of the plurality of first latch circuits;
a plurality of first level shifters for executing level conversion of signals inputted into the plurality of first latch circuits; and a first current source for controlling supply of current to the plurality of first level shifters; and a second unit comprising:
- a plurality of second latch circuits;
- a plurality of second stages of the decoder which output pulses in accordance with the input signals, wherein the pulses decide timing of latching of the plurality of second latch circuits;
- a plurality of second level shifters for executing level conversion of signals inputted into the plurality of second latch circuits; and
- a second current source for controlling supply of current to the plurality of second level shifters, wherein the first current source is configured to stop supply of currents to the plurality of first level shifters while the plurality of second stages of the decoder output the pulses, and wherein the second current source is configured to stop supply of currents to the plurality of second level shifters while the plurality of first stages of the decoder output the pulses.

54. A semiconductor device according to claim 53, wherein said semiconductor device is a liquid crystal display device.

55. A semiconductor device according to claim 53, wherein said display device is incorporated into a personal computer.

56. A semiconductor device according to claim 53, wherein said display device is incorporated into a portable information terminal.

57. A semiconductor device according to claim 53, wherein said display device is incorporated into a car audio set.

58. A semiconductor device according to claim 53, wherein said display device is incorporated into a digital camera.

59. A semiconductor device comprising:
first to x-th (x: natural number, x≧2) units, each of the first to x-th units comprising:
- a plurality of latch circuits;
- a plurality of stages of a decoder which output pulses in accordance with input signals, wherein the pulses decide timing of latching of the plurality of latch circuits;
- a plurality of level shifters for executing level conversion of signals inputted into the plurality of latch circuits; and
- a current source for controlling supply of current to the plurality of level shifters, wherein the current source in one unit is configured to stop supply of currents to the plurality of level shifters while the plurality of stages of the decoder in the other units output the pulses.

60. A semiconductor device according to claim 59, wherein said semiconductor device is a liquid crystal display device.

61. A semiconductor device according to claim 59, wherein said display device is incorporated into a personal computer.

62. A semiconductor device according to claim 59, wherein said display device is incorporated into a portable information terminal.

63. A semiconductor device according to claim 59, wherein said display device is incorporated into a car audio set.

64. A semiconductor device according to claim 59, wherein said display device is incorporated into a digital camera.

* * * * *